(12) United States Patent
Kim et al.

(10) Patent No.: US 12,219,760 B2
(45) Date of Patent: Feb. 4, 2025

(54) SEMICONDUCTOR CHIP AND SEMICONDUCTOR DEVICE INCLUDING THE SAME

(71) Applicant: SAMSUNG ELECTRONICS CO., LTD., Suwon-si (KR)

(72) Inventors: Kangmin Kim, Hwaseong-si (KR); Seungmin Song, Hwaseong-si (KR); Dongseog Eun, Seongnam-si (KR); Seokhwa Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 840 days.

(21) Appl. No.: 17/338,823

(22) Filed: Jun. 4, 2021

(65) Prior Publication Data

US 2022/0123014 A1   Apr. 21, 2022

(30) Foreign Application Priority Data

Oct. 19, 2020 (KR) .................. 10-2020-0135181

(51) Int. Cl.
*H10B 43/27* (2023.01)
*H10B 41/27* (2023.01)
(Continued)

(52) U.S. Cl.
CPC ............ *H10B 43/27* (2023.02); *H10B 41/27* (2023.02); *H10B 41/41* (2023.02); *H10B 43/40* (2023.02)

(58) Field of Classification Search
CPC .................................. H10B 43/27; H10B 43/20
See application file for complete search history.

(56) References Cited

U.S. PATENT DOCUMENTS 10,355,009 B1   7/2019   Kai et al.
10,367,003 B2   7/2019   Kang et al.
(Continued)

FOREIGN PATENT DOCUMENTS

CN   109103198     12/2018
DE   102020111651   4/2021
(Continued)

OTHER PUBLICATIONS

Office Action issued Dec. 18, 2024 in corresponding KR Application No. 10-2020-0135181.

*Primary Examiner* — Christopher A Johnson
(74) *Attorney, Agent, or Firm* — F. Chau & Associates, LLC

(57) ABSTRACT

A semiconductor chip includes a substrate, a source structure disposed on the substrate, and a support pattern disposed on the source structure. Each of the source structure and the support pattern includes polysilicon. The semiconductor chip further includes an electrode structure disposed on the support pattern, and a plurality of vertical structures extending vertically through the electrode structure. The electrode structure includes a lower electrode structure disposed on the support pattern and including a plurality of lower gate electrodes and a plurality of first insulating films, a second insulating film disposed on the lower electrode structure, and an upper electrode structure disposed on the second insulating film and including a plurality of upper gate electrodes and a plurality of third insulating films. The vertical structures contact the source structure above the source structure.

20 Claims, 17 Drawing Sheets

(51) Int. Cl.
    *H10B 41/41*     (2023.01)
    *H10B 43/40*     (2023.01)

(56) References Cited

U.S. PATENT DOCUMENTS

| | | |
|---|---|---|
| 10,388,666 B1 | 8/2019 | Kai et al. |
| 10,490,569 B2 | 11/2019 | Mushiga et al. |
| 2017/0263620 A1 | 9/2017 | Lee |
| 2018/0138195 A1 | 5/2018 | Lee |
| 2018/0374869 A1 | 12/2018 | Kim et al. |
| 2019/0013327 A1 | 1/2019 | He et al. |
| 2019/0157294 A1 | 5/2019 | Kanamori et al. |
| 2019/0326315 A1 | 10/2019 | Lee et al. |
| 2019/0355744 A1 | 11/2019 | Kim et al. |
| 2019/0378856 A1 | 12/2019 | Park et al. |
| 2020/0144288 A1 | 5/2020 | Kanamori et al. |
| 2020/0161321 A1 | 5/2020 | Guo et al. |
| 2021/0111188 A1 | 4/2021 | Song et al. |
| 2022/0005822 A1* | 1/2022 | Manthena ............... H10B 43/10 |
| 2022/0109002 A1* | 4/2022 | Gupta ................ H01L 21/76897 |

FOREIGN PATENT DOCUMENTS

| | | |
|---|---|---|
| KR | 10-2017-0106051 | 9/2017 |
| KR | 1020180053918 | 5/2018 |
| KR | 1020190058079 | 5/2019 |
| KR | 10-2019-0123050 | 10/2019 |
| KR | 1020190122797 | 10/2019 |
| KR | 1020190139064 | 12/2019 |
| KR | 1020200038323 | 4/2020 |

\* cited by examiner

SEMICONDUCTOR CHIP AND SEMICONDUCTOR DEVICE INCLUDING THE SAME

CROSS-REFERENCE TO RELATED APPLICATIONS

This application claims priority under 35 U.S.C. § 119 to Korean Patent Application No. 10-2020-0135181, filed on Oct. 19, 2020 in the Korean Intellectual Property Office, the disclosure of which is incorporated by reference herein in its entirety.

TECHNICAL FIELD

Embodiments of the disclosure relate to a semiconductor chip and an electronic system including the same.

DISCUSSION OF RELATED ART

In an electronic system that stores data, a semiconductor chip capable of storing large volumes of data may be utilized. A method for increasing the data storage capacity of a semiconductor chip may include utilizing three-dimensionally arranged memory cells in place of two-dimensionally arranged memory cells.

To electrically connect channels in a memory cell to a common source line, a method in which the channels contact the common source line at side walls thereof may be used.

SUMMARY

Embodiments of the disclosure provide a method in which a common source line contacts lower portions of channels and a semiconductor chip manufactured using the same.

Embodiments of the disclosure also provide a method for forming word line cuts and channel holes such that the word line cuts and the channel holes are disposed on the same layer or have the same depth.

Embodiments of the disclosure also provide a method for forming support patterns at positions where a dummy channel hole and a word line cut are formed in manufacture of a semiconductor chip.

According to an aspect of the present disclosure, a semiconductor chip includes a substrate, a source structure disposed on the substrate, and a support pattern disposed on the source structure. Each of the source structure and the support pattern includes polysilicon. The semiconductor chip further includes an electrode structure disposed on the support pattern, and a plurality of vertical structures extending vertically through the electrode structure. The electrode structure includes a lower electrode structure disposed on the support pattern and including a plurality of lower gate electrodes and a plurality of first insulating films, a second insulating film disposed on the lower electrode structure, and an upper electrode structure disposed on the second insulating film and including a plurality of upper gate electrodes and a plurality of third insulating films. The vertical structures contact an upper surface of the source structure above the source structure.

According to an aspect of the present disclosure, a semiconductor chip includes a substrate including a cell array region in which cells storing data are disposed, and a connecting region in which a peripheral circuit that provides an electrical signal to the cell array region is disposed. The semiconductor chip further includes a source structure disposed on the substrate and including polysilicon, a support pattern disposed on the source structure and including polysilicon, an electrode structure disposed on the support pattern, and a plurality of vertical structures extending vertically through the electrode structure and contacting the source structure. The electrode structure includes a lower electrode structure disposed on the support pattern and including a plurality of lower gate electrodes and a plurality of first insulating films, a second insulating film disposed on the lower electrode structure, and an upper electrode structure disposed on the second insulating film and including a plurality of upper gate electrodes and a plurality of third insulating films. An upper surface of the substrate is flat in the cell array region.

According to an aspect of the present disclosure, a semiconductor device includes a main substrate, a controller, one or more semiconductor packages, and a dynamic random access memory (DRAM). The controller, the one or more semiconductor packages, and the DRAM are mounted on the main substrate. Each of the semiconductor packages includes a package substrate, a plurality of semiconductor chips disposed on the package substrate, a connecting structure that connects the semiconductor chips to the package substrate, and a molding layer that covers the semiconductor chips and the connecting structure on the package substrate. Each of the semiconductor chips includes a substrate, a source structure disposed on the substrate and including polysilicon, a support pattern disposed on the source structure and comprising polysilicon, an electrode structure disposed on the support pattern, and a plurality of vertical structures extending vertically through the electrode structure. The electrode structure includes a lower electrode structure disposed on the support pattern and including a plurality of lower gate electrodes and a plurality of first insulating films, a second insulating film disposed on the lower electrode structure, and an upper electrode structure disposed on the second insulating film and including a plurality of upper gate electrodes and a plurality of third insulating films. The vertical structures contact an upper surface of the source structure above the source structure.

BRIEF DESCRIPTION OF THE DRAWINGS

The above and other features of the present disclosure will become more apparent by describing in detail embodiments thereof with reference to the accompanying drawings, in which.

DETAILED DESCRIPTION OF EMBODIMENTS

Figure 1:
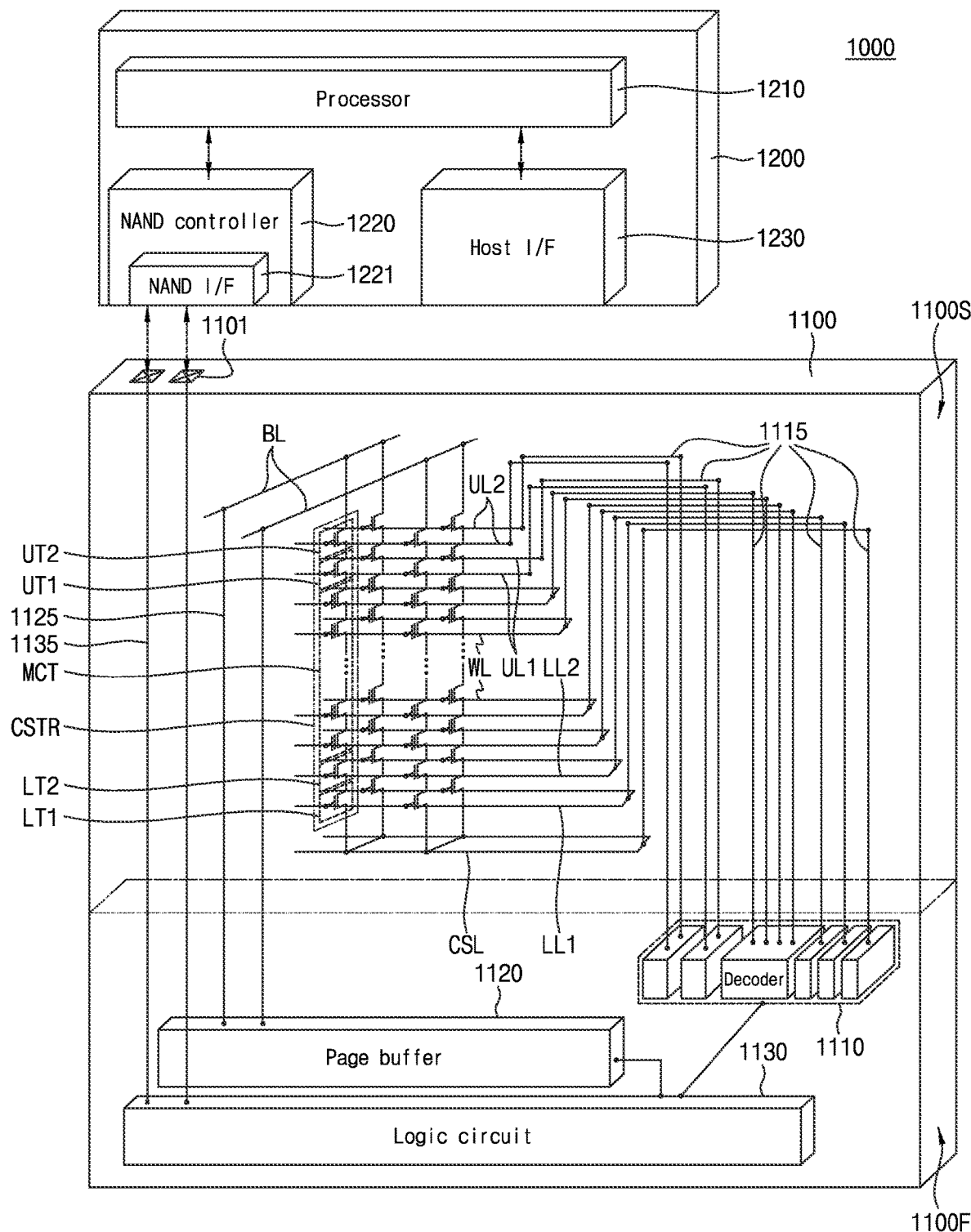
FIG. 1 is a view schematically showing an electronic system including a semiconductor device according to an embodiment of the disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 is a view schematically showing an electronic system including a semiconductor device according to an embodiment of the disclosure.

Referring to FIG. 1, an electronic system 1000 according to an embodiment of the disclosure may include a semiconductor device 1100, and a controller 1200 electrically connected to the semiconductor device 1100. The electronic system may be a storage device including one semiconductor device 1100 or a plurality of semiconductor devices 1100, or an electronic device including the storage device. For example, the electronic system 1000 may be a solid state drive (SSD) device, a universal serial bus (USB) computing system, a medical device, or a communication device which includes one semiconductor device 1100 or a plurality of semiconductor devices 1100.

The semiconductor device 1100 may be a non-volatile memory device. For example, the semiconductor device 1100 may be a NAND flash memory device. The semiconductor device 1100 may include a first structure 1100F, and a second structure 1100S disposed on the first structure 1100F. In embodiments, the first structure 1100F may be disposed at one side of the second structure 1100S. The first structure 1100F may be, for example, a peripheral circuit structure including a decoder circuit 1110, a page buffer 1120, and a logic circuit 1130. The second structure 1100S may be, for example, a memory cell structure including a bit line BL, a common source line CSL, a plurality of word lines WL, first and second upper gate lines UL1 and UL2, first and second lower gate lines LL1 and LL2, and a plurality of memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in accordance with embodiments.

In embodiments, the upper transistors UT1 and UT2 may include a string selection transistor, and the lower transistors LT1 and LT2 may include a ground selection transistor. The lower gate lines LL1 and LL2 may be gate electrodes of the lower transistors LT1 and LT2, respectively. The word lines WL may be gate electrodes of the memory cell transistors MCT, respectively. The upper gate lines UL1 and UL2 may be gate electrodes of the upper transistors UT1 and UT2, respectively.

The common source line CSL, the first and second lower gate lines LL1 and LL2, the word lines WL, and the first and second upper gate lines UL1 and UL2 may be electrically connected to the decoder circuit 1110 via first connecting lines 1115 extending from the first structure 1100F to the second structure 1100S. The bit lines BL may be electrically connected to the page buffer 1120 via second connecting lines 1125 extending from the first structure 1100F to the second structure 1100S.

In the first structure 1100F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through input/output pads 1101 electrically connected to the logic circuit 1130. The input/output pads 1101 may be electrically connected to the logic circuit 1130 via an input/output connecting line 1135 extending from the first structure 1100F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc., may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 2:
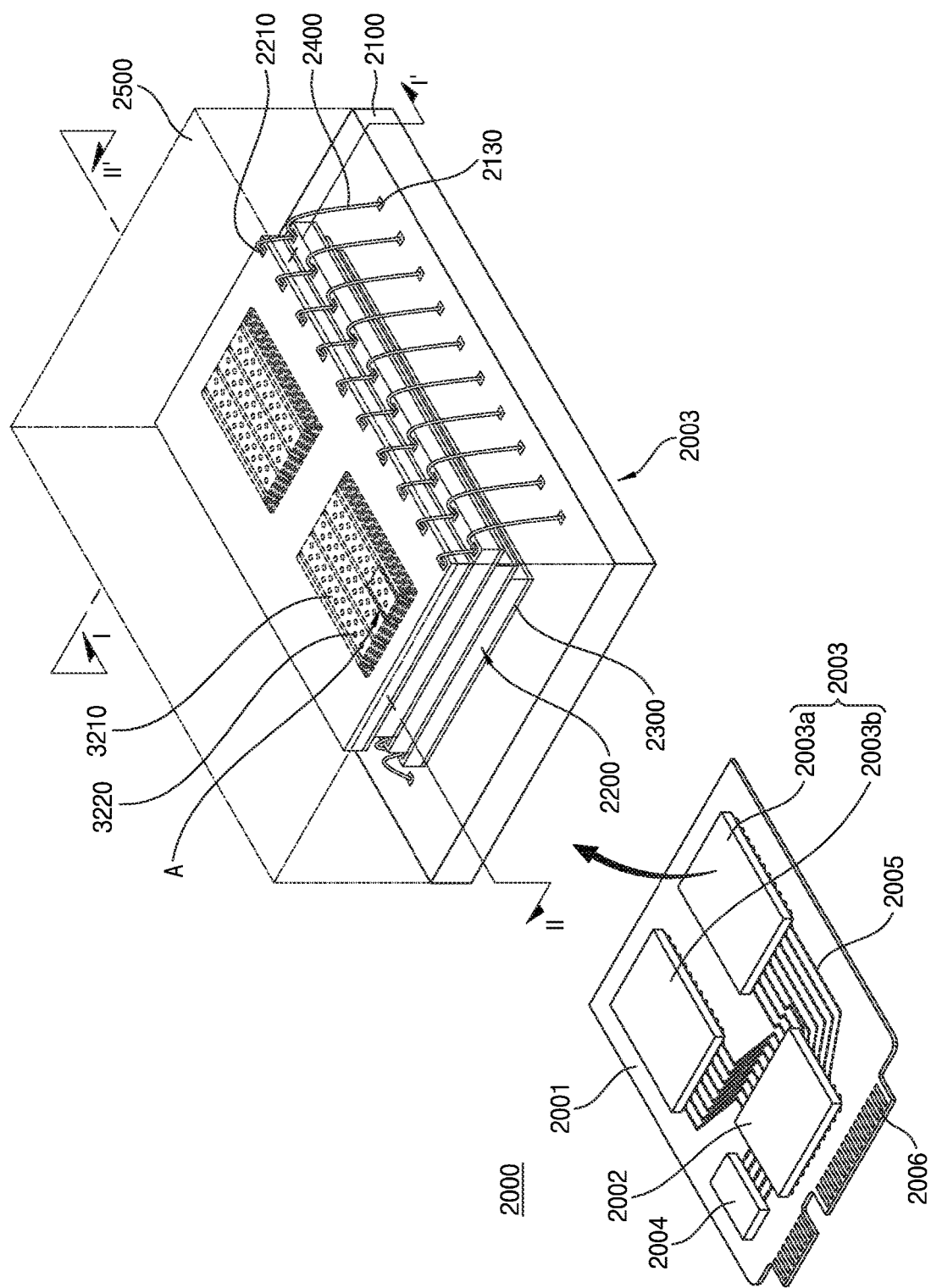
FIG. 2 is a perspective view schematically showing an electronic system including a semiconductor device according to an embodiment of the disclosure.

FIG. 2 is a perspective view schematically showing an electronic system including a semiconductor device according to an embodiment of the disclosure.

Referring to FIG. 2, an electronic system 2000 according to an embodiment of the disclosure may include a main substrate 2001, a controller 2002 mounted on the main substrate 2001, at least one semiconductor package 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins that may be coupled to an external host. The number and arrangement of the plurality of pins in the connector 2006 may be varied in accordance with a communication interface between the electronic system 2000 and the external host. In embodiments, the electronic system 2000 may communicate with the external host in accordance with any one of interfaces such as, for example, a universal serial bus (USB) interface, a peripheral component interconnect express (PCI-Express) interface, a serial advanced technology attachment (SATA) interface, an M-PHY interface for universal flash storage (UFS), etc. In embodiments, the electronic system 2000 may operate using power supplied from the external host. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also increase an operation speed of the electronic system 2000.

The DRAM 2004 may be a buffer memory that reduces a speed difference between the semiconductor package 2003, which is a data storage space, and the external host. The DRAM 2004, which may be included in the electronic system 2000, may also operate as a type of cache memory. The DRAM 2004 may provide a space for temporarily storing data in a control operation for the semiconductor package 2003. When the DRAM 2004 is included in the electronic system 2000, the controller 2002 may further include a DRAM controller that controls the DRAM 2004, in addition to the NAND controller that controls the semiconductor package 2003.

The semiconductor package 2003 may include first and second semiconductor packages 2003a and 2003b, which may be spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 disposed on the package substrate 2100, bonding layers 2300 respectively disposed at lower surfaces of the semiconductor chips 2200, a connecting structure 2400 that electrically connects the semiconductor chips 2200 and the package substrate 2100, and a molding layer 2500 covering the semiconductor chips 2200 and the connecting structure 2400 on the package substrate 2100.

The package substrate 2100 may be a printed circuit board (PCB) including upper package pads 2130. Each of the semiconductor chips 2200 may include input/output pads 2210. The input/output pads 2210 may correspond to the input/output pads 1101 of FIG. 1. Each of the semiconductor chips 2200 may include gate stack structures 3210 and memory channel structures 3220.

In embodiments, the connecting structure 2400 may be bonding wires that electrically connect the input/output pads 2210 and the upper package pads 2130, respectively. Accordingly, in each of the first and second semiconductor packages 2003a and 2003b, the semiconductor chips 2200 thereof may be electrically interconnected in a wire bonding manner, and may be electrically connected to the corresponding upper package pads 2130 of the package substrate 2100. In accordance with embodiments, in each of the first and second semiconductor packages 2003a and 2003b, the semiconductor chips 2200 may be electrically interconnected by a connecting structure including through-silicon vias (TSVs) in place of the bonding wire type connecting structure 2400.

In embodiments, the controller 2002 and the semiconductor chips 2200 may be included in one package. In an embodiment, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 3:
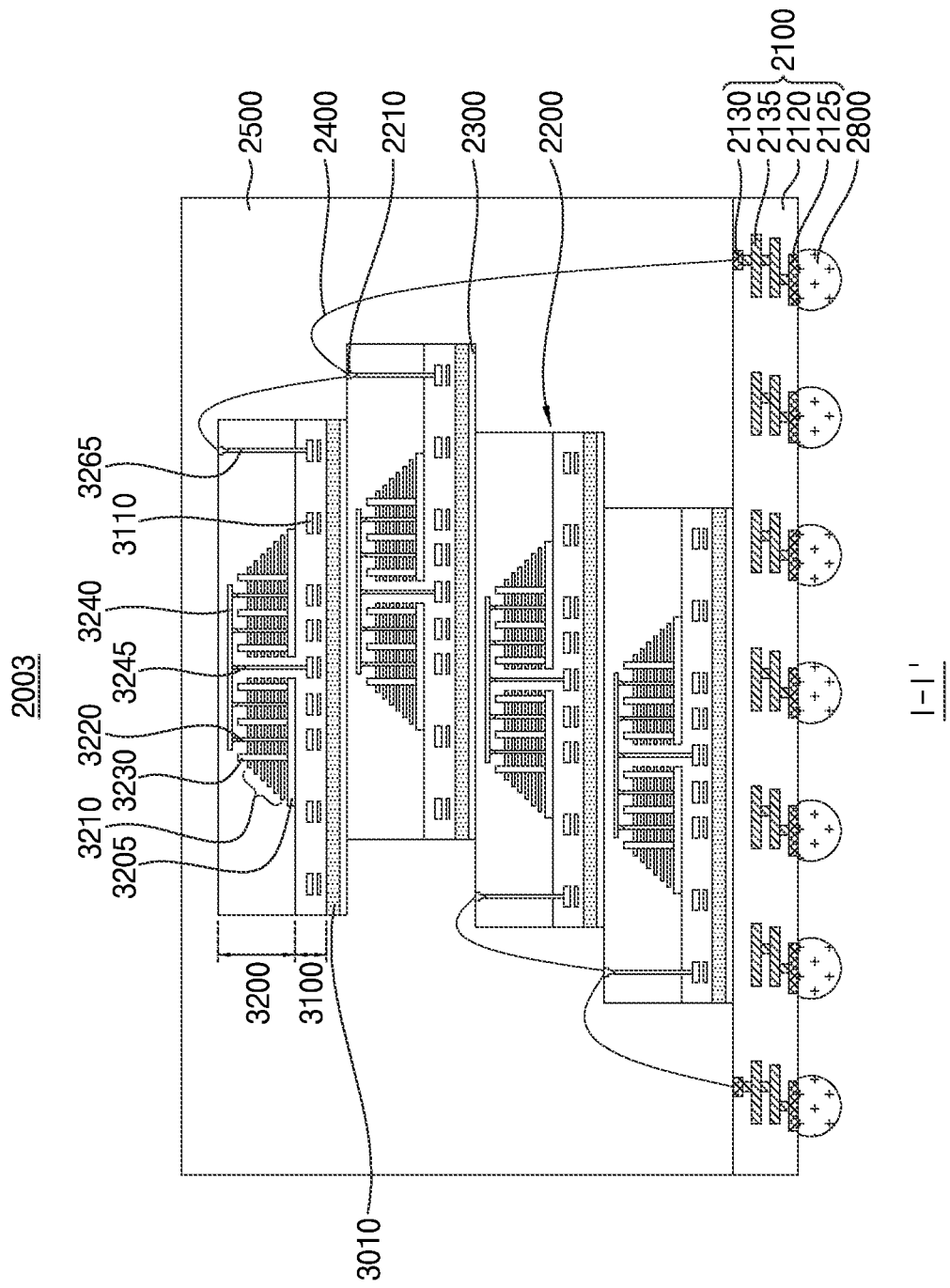
FIGS. 3 and 4 are cross-sectional views schematically showing semiconductor packages according to an embodiment of the disclosure.
Figure 4:
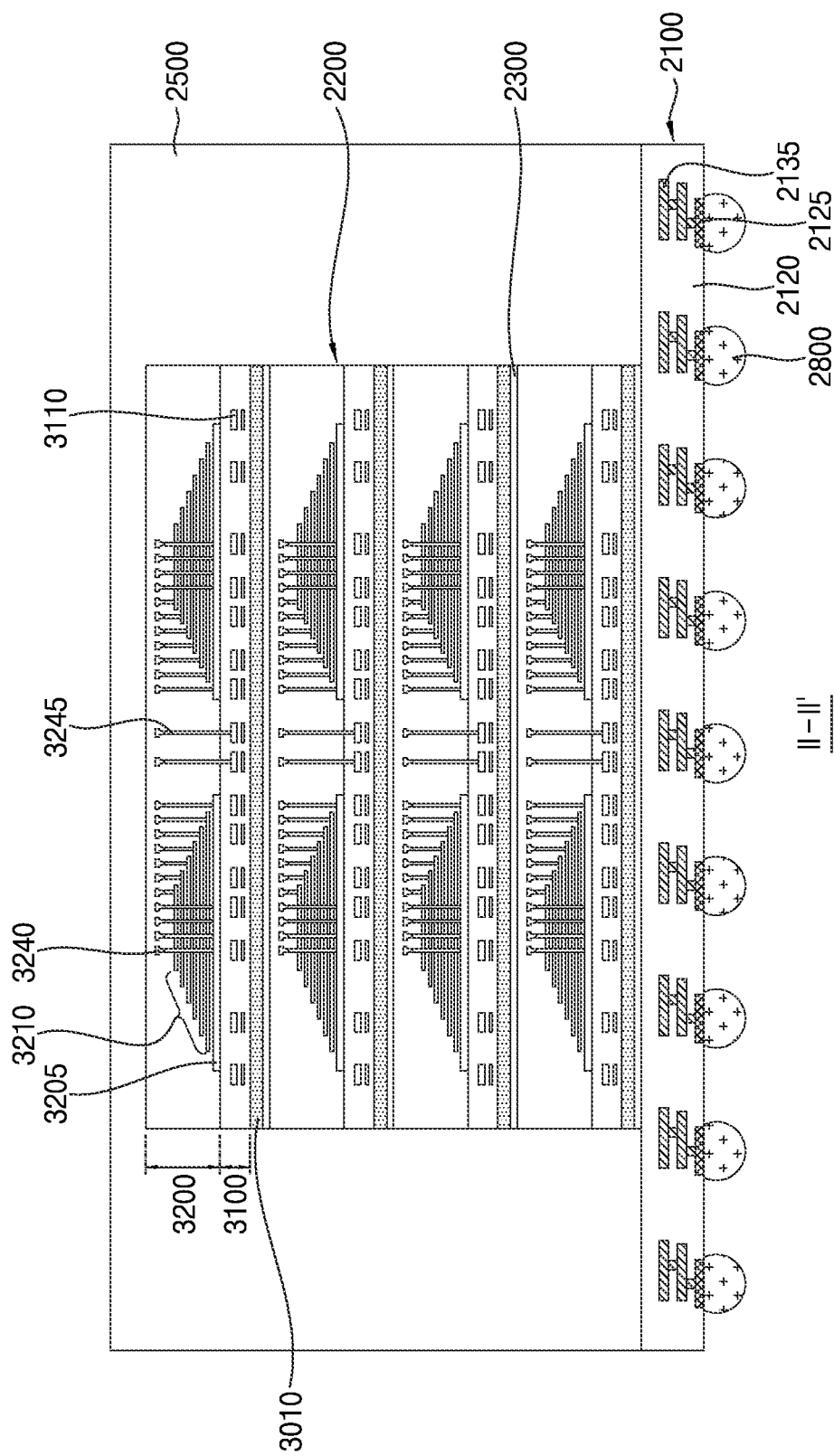

FIGS. 3 and 4 are cross-sectional views schematically showing semiconductor packages according to an embodiment of the disclosure. FIG. 3 corresponds to a cross-sectional view taken along line I-I' in FIG. 2. FIG. 4 corresponds to a cross-sectional view taken along line II-II' in FIG. 2.

Referring to FIG. 3, the package substrate 2100 included in the semiconductor package 2003 may be a printed circuit board. The package substrate 2100 may include a package substrate body 2120, upper package pads 2130 disposed at an upper surface of the substrate body 2120, lower pads 2125 disposed at a lower surface of the package substrate body 2120 or exposed through the lower surface of the package substrate body 2120, and inner wirings 2135 electrically connecting the upper package pads 2130 and the lower pads 2125 within the package substrate body 2120. The upper package pads 2130 may be electrically connected to the connecting structures 2400. The lower pads 2125 may be connected to the wiring patterns 2005 of the main substrate 2010 of the electronic system 2000, as shown in FIG. 2, via, for example, interconnections 2800.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 disposed on the common source line 3205, memory channel structures 3220 and isolation structures 3230 extending through the gate stack structure 3210, bit lines 3240 electrically connected to the memory channel structures 3220, and gate connecting wirings electrically connected to word lines (see WL in FIG. 1) of the gate stack structure 3210.

Each of the semiconductor chips 2200 may include a through-wiring 3245 electrically connected to the peripheral wirings 3110 of the first structure 3100 while extending into the second structure 3200. The through-wiring 3245 may extend through the gate stack structure 3210, and may be disposed outside the gate stack structure 3210. Each of the semiconductor chips 2200 may further include an input/output connecting wiring 3265 electrically connected to the peripheral wirings 3110 of the first structure 3100 while extending into the second structure 3200, and an input/output pad 2210 electrically connected to the input/output connecting wiring 3265.

Referring to FIG. 4, the semiconductor package 2003 may be a chip-to-chip (C2C) structure. The C2C structure may mean a structure in which an upper chip including a cell region is manufactured on a first wafer, a lower chip including a peripheral circuit region is manufactured on a second wafer different from the first wafer, and the upper chip and the lower chip are interconnected in a bonding manner using a bonding method. For example, a bonding method may mean a method in which a bonding metal formed at an uppermost metal layer of the upper chip and a bonding metal formed at an uppermost metal layer of the lower chip are electrically interconnected. For example, when the bonding metal is made of copper (Cu), the bonding method may be a Cu—Cu bonding method. The bonding metal may also be made of, for example, aluminum or tungsten.

Figure 5:
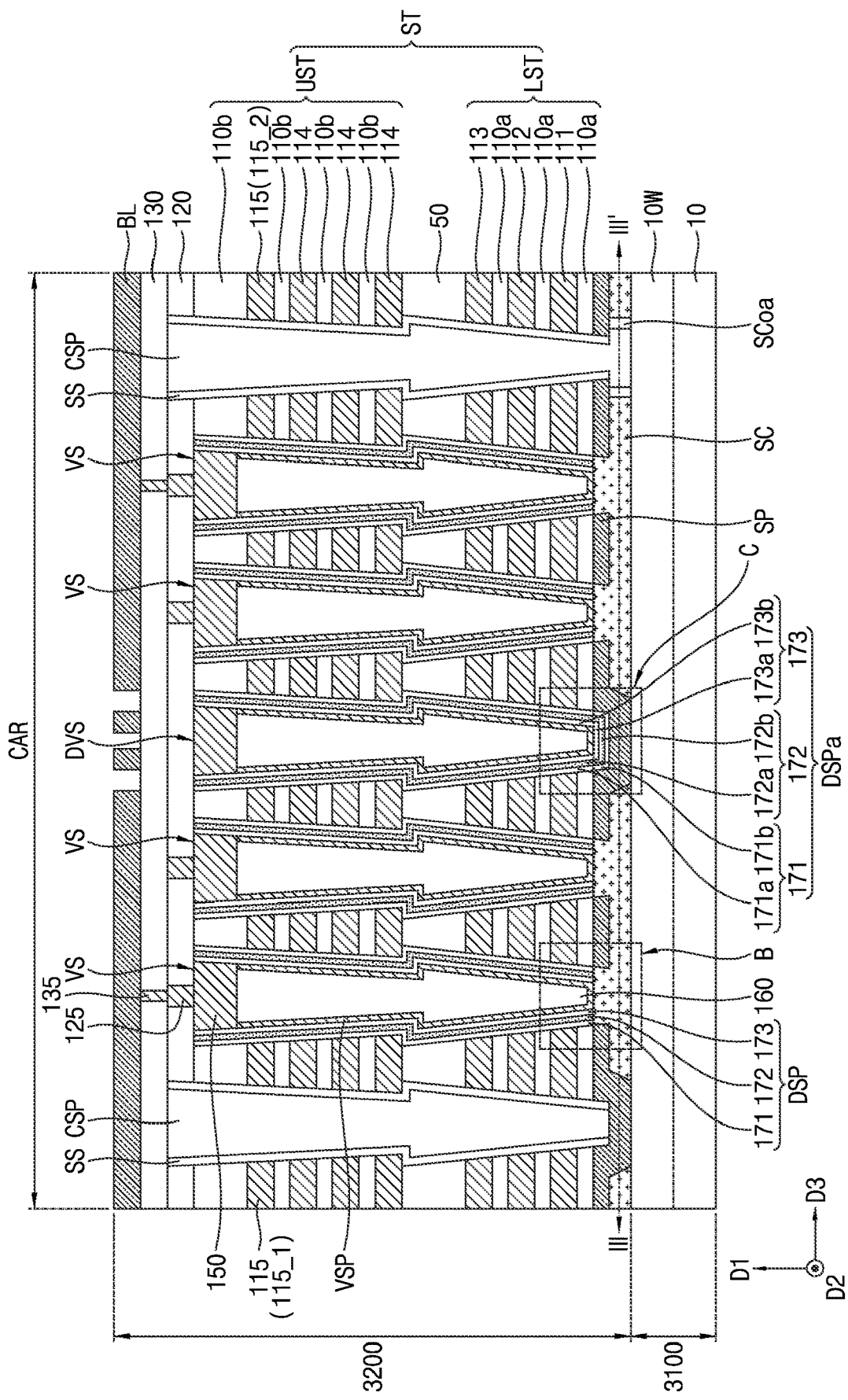
FIG. 5 is a cross-sectional view of a portion of a semiconductor chip according to an embodiment of the disclosure.
Figure 6:
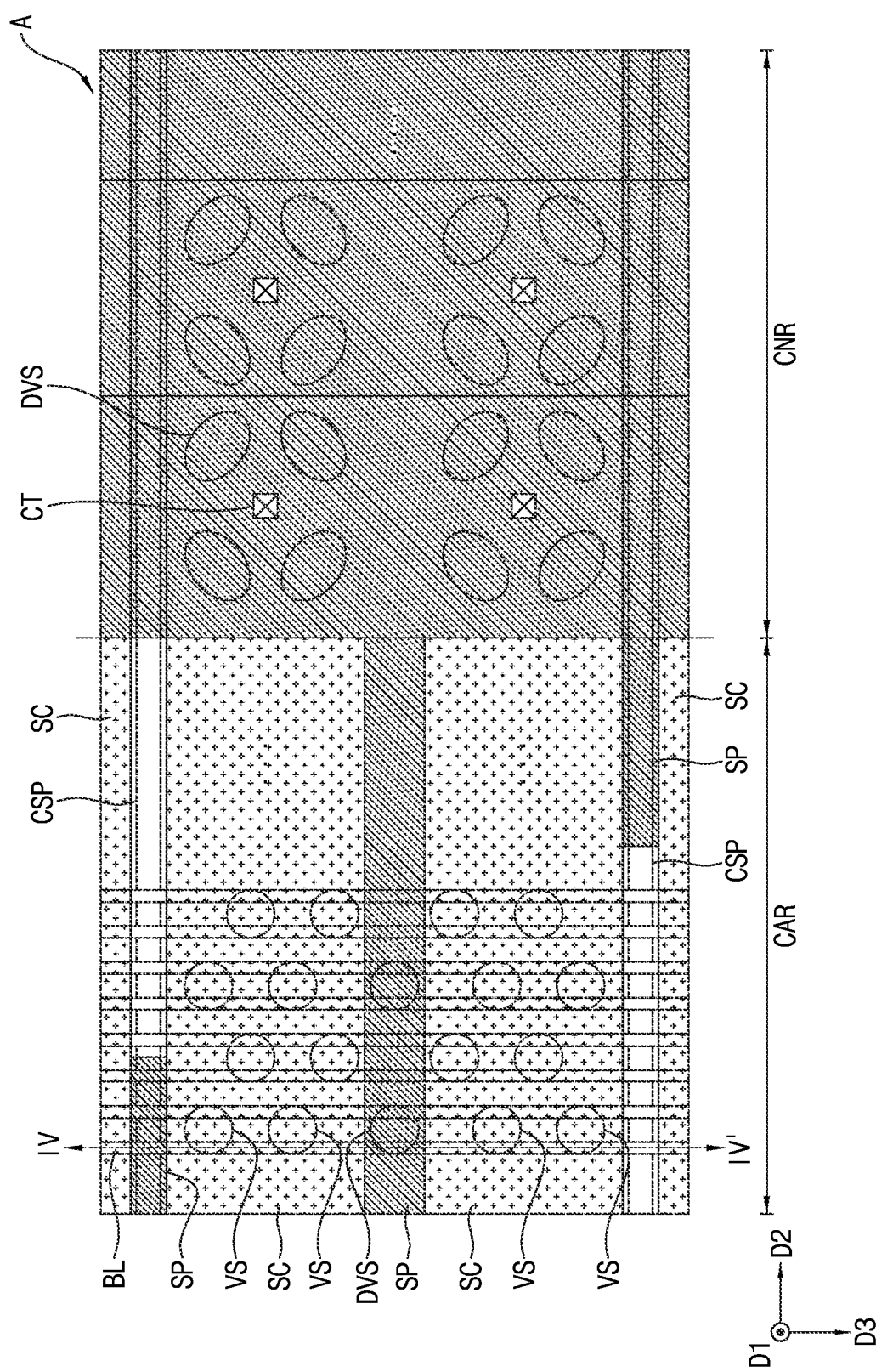
FIG. 6 is a plan view corresponding to a portion of FIG. 5 taken along line III-III' in FIG. 5.
Figure 7:
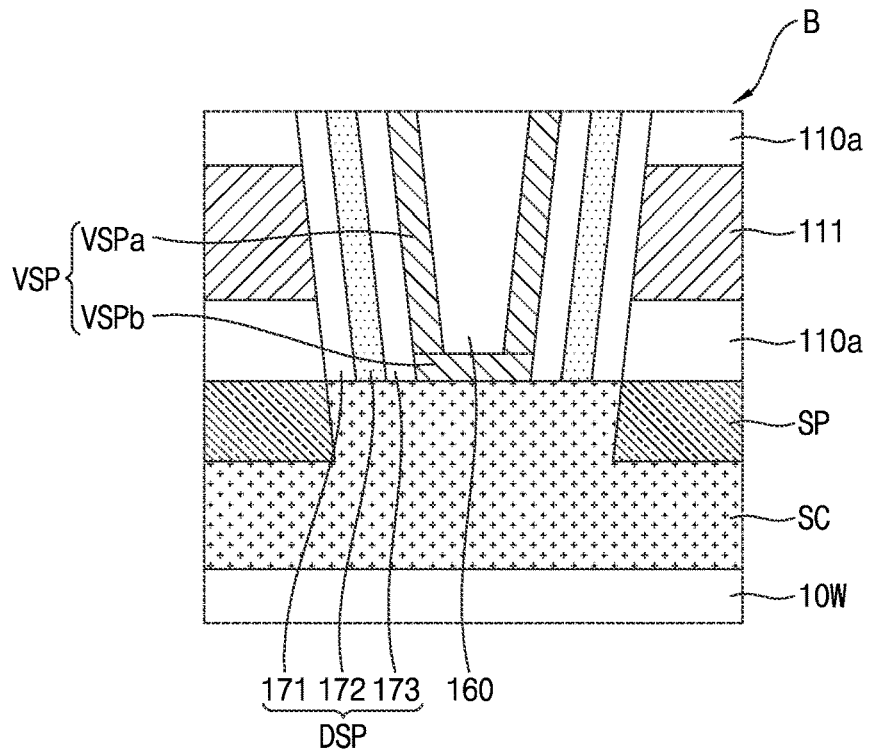
FIG. 7 is an enlarged cross-sectional view of region B in FIG. 5.
Figure 8:
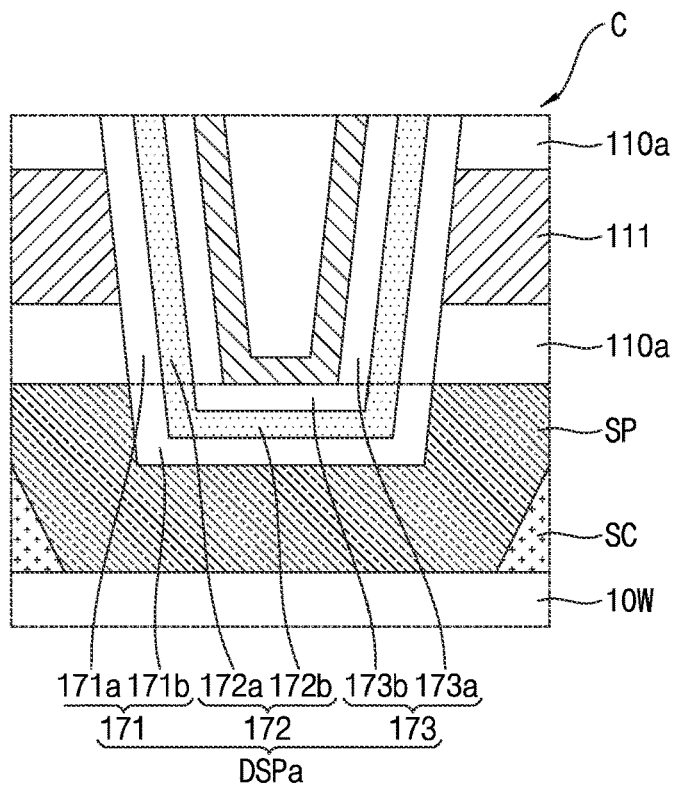
FIG. 8 is an enlarged cross-sectional view of region C in FIG. 5.

FIG. 5 is a cross-sectional view of a portion of a semiconductor chip according to an embodiment of the disclosure. FIG. 6 is a plan view corresponding to a portion of FIG. 5 taken along line III-III' in FIG. 5. FIG. 7 is an enlarged cross-sectional view of region B in FIG. 5. FIG. 8 is an enlarged cross-sectional view of region C in FIG. 5.

FIG. 5 corresponds to a cross-sectional view taken along line IV-IV' in FIG. 6, and FIG. 6 corresponds to region A in FIG. 2. In FIG. 6, positions where vertical structures VS, dummy vertical structure DVS, and common source plugs CSP will be formed are shown by dotted lines to represent relative positions of elements.

Referring to FIGS. 5 to 8, a semiconductor substrate 10 may correspond to the semiconductor substrate 3010 and/or the first structure 3100 described with reference to FIGS. 3 and 4. The substrate 10 may include a cell array region CAR and a connecting region CNR. The cell array region CAR may be a region in which cells that store data are disposed. The connecting area CNR may be a region in which a peripheral circuit that provides an electrical signal for data storage to the cell array region CAR is disposed.

The substrate 10 may be a semiconductor substrate such as, for example, a silicon substrate, a germanium substrate, or a silicon-germanium substrate. A well region 101V may be provided at an upper portion of the substrate 10 within the substrate 10. The substrate 10 may have a first conductivity type, and the well region 10W may include impurities having a second conductivity type different from the first conductivity type. For example, the first conductivity type may be P type, and the second conductivity type may be N type. In accordance with some embodiments, the well region 10W may be omitted. In an embodiment, an upper surface of the cell array region CAR of the substrate 10 may be a flat surface.

A source structure SC, a support pattern SP, and an electrode structure ST may be sequentially stacked on the substrate 10. The source structure SC and the electrode structure ST may be sequentially stacked in a first direction D1 (thickness direction) perpendicular to an upper surface of the substrate 10.

The source structure SC may be interposed between the substrate 10 and the electrode structure ST, and may be provided on the well region 10W. In some embodiments, the source structure SC may be provided on the substrate 10 or the well region 10W. The source structure SC may include the common source line CSL described with reference to FIG. 1.

The source structure SC may extend under the electrode structure ST in a second direction D2 parallel to the upper surface of the substrate 10.

In an embodiment, the source structure SC may be directly disposed on (e.g., may directly contact) the substrate 10. For example, the source structure SC may directly contact the well region 10W. In some embodiments, an insulating film may be provided between the source structure SC and the well region 10W.

In an embodiment, the source structure SC may include a semiconductor material doped with an impurity having a second conductivity type. For example, the source structure SC may include polysilicon doped with an N-type impurity (for example, phosphorous (P) or arsenic (As)). In accordance with an embodiment, the source structure SC may have recessed side surfaces.

In an embodiment, the source structure SC may include oxidized regions SCoa oxidized to a predetermined thickness at portions of the source structure SC contacting common source plugs CSP, respectively.

The support pattern SP may support the electrode structure ST from the substrate 10 or the well region 10W. The support pattern SP may be disposed on the source structure SC at a portion thereof. The support pattern SP may be directly interposed between the substrate 10 or the well region 10W and the electrode structure ST at the other portion thereof.

In an embodiment, the support pattern SP may overlap at least a part of regions where the common source plugs CSP are disposed, regions where the dummy vertical structures DVS are disposed, and the connecting region CNR. In an embodiment, the support pattern SP may extend along regions where the dummy vertical structures DVS in the cell array region CAR are disposed (for example, in the second direction D2). In accordance with an embodiment, the support pattern SP may be disposed over the entire surface of the connecting region CNR.

The support pattern SP may include a semiconductor material doped with an impurity having a second conductivity type. For example, the support pattern SP may include polysilicon doped with an N-type impurity (for example, phosphorous (P) or arsenic (As)). In an embodiment, the impurity concentration of the support pattern SP may differ from the impurity concentration of the source structure SC. For example, the impurity concentration of the support pattern SP may be lower than the impurity concentration of the source structure SC. That is, the concentration of the N-type impurity may be greater in the source structure SC than in the support pattern SP. The etch selectivity of the support pattern SP may differ from the etch selectivity of the source structure SC.

The other portion of the support pattern SP may cover a portion of an upper surface of the source structure SC, and may extend to the recessed side surfaces of the source structure SC to cover the recessed side surfaces. In an embodiment, the one portion of the support pattern SP may cover the recessed side surfaces of the source structure SC, and may contact the substrate 10 or the well region 10W.

In an embodiment, the source structure SC may be locally provided on the cell array region CAR, and the support pattern SP may be provided on both the cell array region CAR and the connecting area CNR.

The electrode structure ST may extend from the cell array region CAR to the connecting area CNR in the second direction D2 parallel to the upper surface of the substrate 10.

The electrode structure ST may include a lower electrode structure LST, an upper electrode structure UST, and a planarizing insulating film 50 provided between the lower electrode structure LST and the upper electrode structure UST. The planarizing insulating film 50 may also be referred to as a second insulating film. The lower electrode structure LST may include lower gate electrodes 111, 112 and 113 and lower insulating films 110a which are alternately stacked on the source structure SC in the first direction D1. The lower insulating films 110a may also be referred to as first insulating films. The upper electrode structure UST may include upper gate electrodes 114 and 115 and upper insulating films 110b which are alternately stacked on the planarizing insulating film 50 in the first direction D1. The upper insulating films 110b may also be referred to as third insulating films.

The numbers of the lower gate electrodes 111, 112 and 113, the lower insulating films 110a, the upper gate electrodes 114 and 115, and the upper insulating films 110b are not limited to those shown in the drawings, and may vary according to embodiments.

The planarizing insulating film 50 may be interposed between an uppermost one of the lower gate electrodes 111, 112 and 113, that is, the uppermost lower gate electrode 113, and a lowermost one of the gate electrodes 114. Each of the lower insulating films 110a, the upper insulating films 110b, and the planarizing insulating film 50 may have a thickness in the first direction D1. The planarizing insulating film 50 may have a greater thickness than the lower and upper insulating films 110a and 110b. An uppermost one of the lower and upper insulating films 110a and 110b, that is, the uppermost insulating film 110b, may be thicker than the remaining ones of the lower and upper insulating films 110a and 110b.

Each of the lower insulating films 110a, the upper insulating films 110b, and the planarizing insulating film 50 may include, for example, a silicon oxide film and/or a low-k dielectric film.

The lower gate electrodes 111, 112 and 113 may include a cell gate electrode 111, an erase control gate electrode 112 disposed on the cell gate electrode 111, and a ground selection gate electrode 113 disposed on the erase control gate electrode 112. A lowermost one of the lower gate electrodes 111, 112 and 113 (for example, the cell gate electrode 111) may be adjacent to the source structure SC. The erase control gate electrode 112 and the ground selection gate electrode 113 may correspond to respective electrodes of the lower transistors LT1 and LT2 shown in FIG. 1.

A lowermost one of the lower insulating films 110a may be interposed between the cell gate electrode 111 and the support pattern SP (or the source structure SC). The erase control gate electrode 112 may be used as a gate electrode of an erase control transistor controlling an erase operation (for example, one of the lower transistors LT1 and LT2 shown in FIG. 1). In an embodiment, the erase control gate electrode 112 may have a structure extending in the second direction D2. In an embodiment, the ground selection gate electrode 113 may have the form of a line extending in the second direction D2, and the ground selection gate electrode 113 may be spaced apart from a ground selection gate electrode adjacent thereto. The ground selection gate electrode 113 may be disposed on the erase control gate electrode 112. The ground selection gate electrode 113 may be used as a gate electrode of a ground selection transistor (for example, the other one of the lower transistors LT1 and LT2 shown in FIG. 1).

The upper gate electrodes 114 and 115 may include cell gate electrodes 114 and a string selection gate electrode 115. The cell gate electrodes 114 may be provided between the ground selection gate electrode 113 and the string selection gate electrode 115, and may be disposed at different heights from the upper surface of the substrate 10. The cell gate electrodes 114 may be used as gate electrodes of the memory cell transistors MCT shown in FIG. 1. The upper gate electrodes 114 and 115 may include a plurality of cell gate electrodes 114, but are not limited to the number of the cell gate electrodes 114 as shown. In this case, the ground selection gate electrodes 113 may be disposed under line portions of a lowermost one of the cell gate electrodes 114, respectively.

The string selection gate electrode 115 may include a pair of string selection gate electrodes 115_1 and 115_2 horizontally spaced apart from each other. The pair of string selection gate electrodes 115_1 and 115_2 may be spaced apart from each other in a third direction D3. The pair of string selection gate electrodes 115_1 and 115_2 may be isolated from each other by an isolation insulating film which is interposed between the string selection gate electrodes 115_1 and 115_2 while having the form of a line extending in the second direction D2 and including an insulating material (for example, a silicon oxide film). The string selection gate electrode 115 may be used as the gate electrode of the string selection transistor described with reference to FIG. 1. In accordance with some embodiments, an additional string selection gate electrode 115 may be provided between an uppermost one of the cell gate electrodes 114 and the string selection gate electrode 115. In this case, the additional string selection gate electrode 115 may include a pair of additional string selection gate electrodes 115_1 and 115_2 spaced apart from each other in the third direction D3, and the string selection gate electrodes 114 may be used as the gate electrodes of the string selection transistors described with reference to FIG. 1. In an embodiment, lengths of the gate electrodes 111, 112, 113 and 114 of the electrode structure ST (lengths in the second direction D2) may be gradually reduced as the gate electrodes 111, 112, 113 and 114 are disposed farther from the substrate 10. The gate electrodes 111, 112, 113 and 114 of the electrode structure ST may include electrode pads forming a stepped structure in the connecting region CNR.

Each of the lower gate electrodes 111, 112 and 113 and the upper gate electrodes 114 may include a doped semiconductor (for example, doped silicon, etc.), a metal (for example, tungsten, copper, aluminum, etc.), a conductive metal nitride (for example, titanium nitride, tantalum nitride, etc.) and/or a transition metal (for example, titanium, tantalum, etc.).

The vertical structures VS may be disposed in the cell array region CAR of the substrate 10. A part of the dummy vertical structures DVS may be disposed in the cell array region CAR of the substrate 10, and the other part of the dummy vertical structures DVS may be disposed in the connecting area CNR of the substrate 10.

Each of the vertical structures VS may extend in the first direction D1 such that the vertical structure VS may extend through the electrode structure ST. That is, the vertical structures VS may extend through the upper electrode structure UST, the planarizing insulating film 50, and the lower electrode structure LST in a vertical direction (for example, the first direction D1). In an embodiment, each of the vertical structures VS does not extend through the source structure SC and the support pattern SP. That is, in an embodiment, each of the vertical structures VS may be directly disposed on (e.g., may directly contact) the source structure SC or the support pattern SP. For example, each of the vertical structures VS may be disposed above the source structure SC such that the vertical structure VS may contact the source structure SC at a bottom portion thereof. For example, the vertical structures VS may be arranged in the second direction D2 in a zigzag manner when viewed in a plan view. In an embodiment, each of the dummy vertical structures DVS may extend through a corresponding one of the electrode pads and the electrode structure ST under the corresponding electrode pad. Each of the vertical structures VS and the dummy vertical structures DVS may have a width in a direction parallel to the upper surface of the substrate 10. In accordance with an embodiment, widths of the vertical structures DVS disposed in the connecting region CNR may be greater than widths of the vertical structures VS, and widths of the dummy vertical structures DVS disposed in the cell array region CAR may be about equal to the widths of the vertical structures VS. In an embodiment, depths of the dummy vertical structures DVS disposed in the cell array region CAR may be greater than depths of the vertical structures VS.

Each of the vertical structures VS may include a vertical semiconductor pattern VSP. The vertical semiconductor pattern VSP may extend in the first direction D1 such that the vertical semiconductor pattern VSP may extend through the electrode structure ST and may extend to an upper surface of the source structure SC. The vertical semiconductor pattern VSP may have the form of a pipe closed at a lower end thereof.

In an embodiment, the vertical semiconductor pattern VSP may have the form of a cup opened at an upper end thereof while being closed at a lower end thereof. That is, in an embodiment, the vertical semiconductor pattern VSP may have a cup shape having an opened upper end and a closed lower end. For example, the cup shape of the vertical semiconductor pattern VSP may include a bottom portion VSPb and a side portion VSPa extending upward from the bottom portion VSPb, thus forming the opened upper end and the closed lower end. The vertical semiconductor pattern VSP may contact the source structure SC. In an embodiment, the bottom portion VSPb of the vertical semiconductor pattern VSP may contact the source structure SC.

The vertical semiconductor pattern VSP may include a semiconductor material such as, for example, silicon (Si), germanium (Ge) or a compound thereof. In addition, the vertical semiconductor pattern VSP may be a semiconductor doped with an impurity or an intrinsic semiconductor in an impurity-undoped state. The vertical semiconductor pattern VSP may be used as channels of the upper transistors UT1 and UT2, the lower transistors LT1 and LT2, and the memory cell transistors MCT described with reference to FIG. 1.

Each of the vertical structures VS may include a data storage pattern DSP interposed between the vertical semiconductor pattern VSP and the electrode structure ST. The data storage pattern DSP may extend in the first direction D1, and may surround a side wall of the vertical semiconductor pattern VSP. The data storage pattern DSP may have the form of a pipe opened at upper and lower ends thereof. The data storage pattern DSP may contact the source structure SC at a bottom portion thereof. The data storage pattern DSP may include a data storage film of a NAND flash memory device. The data storage pattern DSP may include a charge storage film 172 disposed between the vertical semiconductor pattern VSP and the electrode structure ST, a blocking insulating film 171 disposed between the electrode structure ST and the charge storage film 172, and a tunnel insulating film 173 disposed between the vertical semiconductor pattern VSP and the charge storage film 172. For example, the charge storage film 172 may include at least one of a silicon nitride film, a silicon oxynitride film, a silicon-rich nitride film, nanocrystalline silicon, or a laminated trap layer. The blocking insulating film 171 may include a material having a greater bandgap than the charge storage film 172. The blocking insulating film 171 may include a high-k dielectric film such as, for example, an aluminum oxide film, a hafnium oxide film, etc. The tunnel insulating film 173 may include a material having a greater bandgap than the charge storage film 172. For example, the tunnel insulating film 173 may include a silicon oxide film.

Each of the vertical structures VS may include an insulating pattern 160 filling an interior of the vertical semiconductor pattern VSP. The insulating pattern 160 may include, for example, a silicon oxide.

Each of the vertical structures VS may include a conductive pad 150 disposed on the vertical semiconductor pattern VSP. The conductive pattern may cover an upper surface of the insulating pattern 160 and an uppermost surface of the vertical semiconductor pattern VSP. The conductive pad 150 may include an impurity-doped semiconductor material and/ or a conductive material.

The data storage pattern DSP may extend from a side surface of the vertical semiconductor pattern VSP to a surface of the conductive pad 150 such that the data storage pattern DSP is disposed on the surface of the conductive pad 150. The data storage pattern DSP may surround the side surface of the conductive pad 150, and an uppermost surface of the data storage pattern DSP may be substantially flush with an upper surface of the conductive pad 150.

Both the data storage pattern DSP and the vertical semiconductor pattern VSP may be disposed above the source structure SC.

Each of the dummy vertical structures DVS disposed in the cell array region CAR may include a dummy data storage pattern DSPa. In an embodiment, the data storage pattern DSPa may have the form of a cup opened at an upper end thereof while being closed at a lower end thereof. The data storage pattern DSPa may include portions 171a, 172a and 173a forming a side wall surrounded by the electrode structure ST, and portions 171b, 172b and 173b forming a bottom portion. The dummy vertical structures DVS disposed in the cell array region CAR may be directly disposed on (e.g., may directly contact) the support pattern SP. The portions 171b, 172b and 173b, which form the bottom portion, may contact the support pattern SP. In an embodiment, the dummy vertical structures DVS disposed in the cell array region CAR may extend into the support pattern ST. In an embodiment, the dummy vertical structures DVS disposed in the cell array region CAR do not extend through the support pattern SP. The portions 171b, 172b and 173b, which form the bottom portion, may be disposed below an upper surface of the support pattern ST.

Common source plugs CSP may be provided at opposite sides of the electrode structure ST, respectively. The common source plugs CSP may extend in the third direction D3, and may be disposed in the cell array region CAR and the connecting area CNR. The common source plugs CSP may be connected to the substrate 10 or the well region 10W in a predetermined region.

The common source plugs CSP may extend through the source structure SC and the support pattern SP in the predetermined region. The common source plugs CSP may be directly disposed on (e.g., may directly contact) the support pattern SP in a region other than the predetermined region. The common source plugs CSP may extend in the second direction D2, and may be spaced apart from each other in the third direction D3 under the condition that the electrode structure ST is interposed between the common source plugs CSP. For example, the common source plugs CSP may include a conductive material. In an embodiment, lowermost ends of the common source plugs CSP may be directly disposed on (e.g., may directly contact) the substrate 10 or the well region 10W in a predetermined region. In this case, the upper surface of the substrate 10 or the well region 10W may be substantially flat, irrespective of whether the upper surface contacts the common source plugs CSP.

Side insulating spacers SS may be provided at opposite sides of the electrode structure ST, respectively. Each of the side insulating spacers SS may be interposed between a corresponding one of the common source plugs CSP and the electrode structure ST. Each of the side insulating spacers SS may extend between the corresponding common source plug CSP and the source structure SC and/or the support pattern SP, and may contact the substrate 10, the well region 10W, or the support pattern SP. For example, the side insulating spacers SS may include polysilicon or silicon nitride.

A capping insulating film 120 may cover an upper surface of the electrode structure ST, an upper surface of the conductive pad 150, and an upper surface of the upper insulating film 110b. An upper surface of the capping insulating film 120 may be substantially flush with upper surfaces of the common source plugs CSP.

An interlayer insulating film 130 may be provided on the capping insulating film 120 and may cover the upper surfaces of the common source plugs CSP.

The lower insulating film 110a, the upper insulating film 110b, the capping insulating film 120, and the interlayer insulating film 130 may include an insulating material (for example, silicon oxide).

A first contact 125 may be provided on the conductive pad 150. The first contact 125 may extend through the capping insulating film 120 such that the first contact 125 may be connected to the conductive pad 150. A second contact 135 may extend through the interlayer insulating film 130 such that the second contact 135 may be connected to the first contact 125. The first contact 125 and the second contact 135 may include a conductive material.

Bit lines BL may be provided on the interlayer insulating film 130. The bit lines BL may extend in the third direction D3 while being spaced apart from one another in the second direction D2.

Each of the dummy vertical structures DVS disposed in the cell array region CAR may be a cell dummy vertical structure including a cell dummy vertical semiconductor pattern that is not connected to the first contact 125 or the second contact 135. Each vertical semiconductor pattern VSP of the vertical structures VS, except the cell dummy vertical structures, may be electrically connected to a corresponding one of the bit lines BL via the first contact 125 and the second contact 135. The bit lines BL may include a conductive material.

Conductive contacts CT formed in the connecting region CNR may be connected to electrode pads of the gate electrodes 111, 112, 113 and 114, respectively.

FIGS. 9 to 17 are cross-sectional views showing a method of manufacturing a semiconductor chip in accordance with an embodiment of the disclosure.

The semiconductor chip manufacturing method may include of the processes described with reference to FUGs. 9 to 17.

Figure 9:
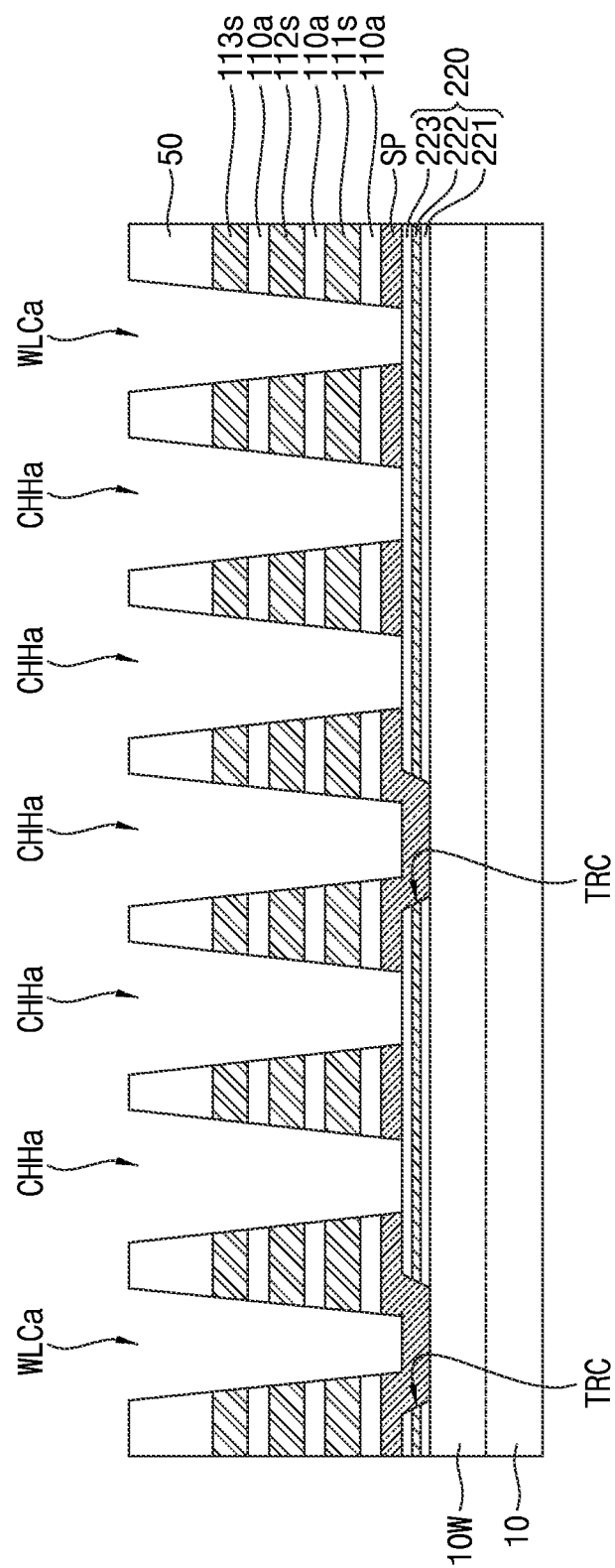
FIGS. 9 to 17 are cross-sectional views showing a method of manufacturing a semiconductor chip in accordance with an embodiment of the disclosure.

First, referring to FIG. 9, a first sacrificial layer 220, a support pattern SP, lower sacrificial structures 111s, 112s and 113s, lower insulating films 110a, and a planarizing insulating film 50 may be formed on a substrate 10 or a well region 10W.

After covering an upper surface of the substrate 10, the first sacrificial layer 220 may be formed with a trench TRC exposing a portion of the upper surface of the substrate 10 or an upper surface of the well region 10W. The support pattern SP on the first sacrificial layer 220 may be formed to extend into the trench TRC such that the support pattern SP may include a region contacting the substrate 10 or the well region 10W.

In an embodiment, the first sacrificial layer 220 may include a first sub-sacrificial film 221, a second sub-sacrificial film 222, and a third sub-sacrificial film 223, which are sequentially stacked. The second sub-sacrificial film 222 may be disposed between the first sub-sacrificial film 221 and the third sub-sacrificial film 223. The second sub-sacrificial film 222 may include at least one of, for example, a silicon nitride film, a silicon oxynitride film, a silicon-rich nitride film, nanocrystalline silicon, or a laminated trap layer. Each of the first sub-sacrificial film 221 and the third sub-sacrificial film 223 may include, for example, an aluminum oxide film, a hafnium oxide film, or a silicon oxide film. In an embodiment, etch selectivity of each of the first sub-sacrificial film 221, the second sub-sacrificial film 222, and the third sub-sacrificial film 223 of the first sacrificial layer 220 may differ from etch selectivity of each of a blocking insulating film 171, a charge storage film 172, and a tunnel insulating film 173 of a data storage pattern DSP.

Thereafter, a plurality of first channel holes CHHa and a plurality of first word line cuts WLCa may be formed to extend through the lower sacrificial structures 111s, 112s and 113s, the lower insulating films 110a, and the planarizing insulating film 50. The plurality of first channel holes CHHa and the plurality of first word line cuts WLCa may be formed through execution of an anisotropic etching process for the lower sacrificial structures 111s, 112s and 113s, the lower insulating films 110a, the planarizing insulating film 50, and the support pattern SP. In accordance with an embodiment, an anisotropic etching process is performed for the lower sacrificial structures 111s, 112s and 113s, the lower insulating films 110a, and the planarizing insulating film 50 while using the support pattern SP as an etch stop layer, and an isotropic etching process is subsequently performed for the support pattern SP while using the first sacrificial layer 220 as an etch stop layer. Positions where the plurality of first word line cuts WLCa are formed may include positions where common source plugs CSP will be produced. Positions where the plurality of first channel holes CHHa are formed may include positions where vertical structures VS and dummy vertical structures DVS will be produced. The first channel holes CHHa formed at the positions where the dummy vertical structures DVS will be produced may be referred to as dummy channel holes.

In an embodiment, the support pattern SP may be removed from regions where the plurality of first channel holes CHHa and the plurality of first word line cuts WLCa overlap the first sacrificial layer 220, thereby exposing the first sacrificial layer 220. In an embodiment, the support pattern SP is not removed from regions where the plurality of first channel holes CHHa and the plurality of first word line cuts WLCa overlap with the trench TRC and, as such, may be exposed at the regions. In an embodiment, the plurality of first channel holes CHHa and the plurality of first word line cuts WLCa may have a greater depth in the regions exposing the support pattern SP than in the regions from which the support pattern SP is removed. That is, the support pattern SP may be over-etched in the trench TRC through an anisotropic etching process for forming the plurality of first channel holes CHHa and the plurality of first word line cuts WLCa.

Figure 10:
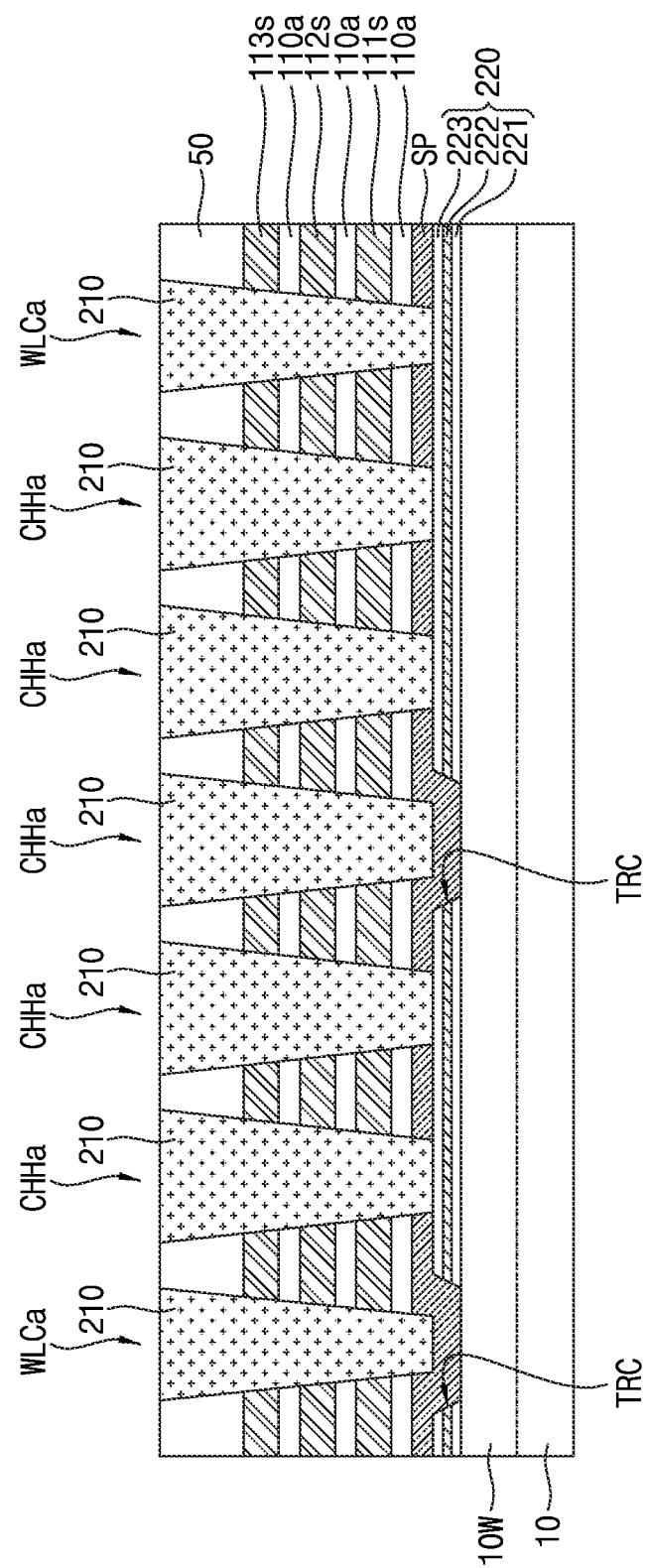

Subsequently, referring to FIG. 10, a second sacrificial layer 210 filling the plurality of first channel holes CHHa and the plurality of first word line cuts WLCa may be formed. For example, the second sacrificial layer 210 may include polysilicon or tungsten (W).

Figure 11:
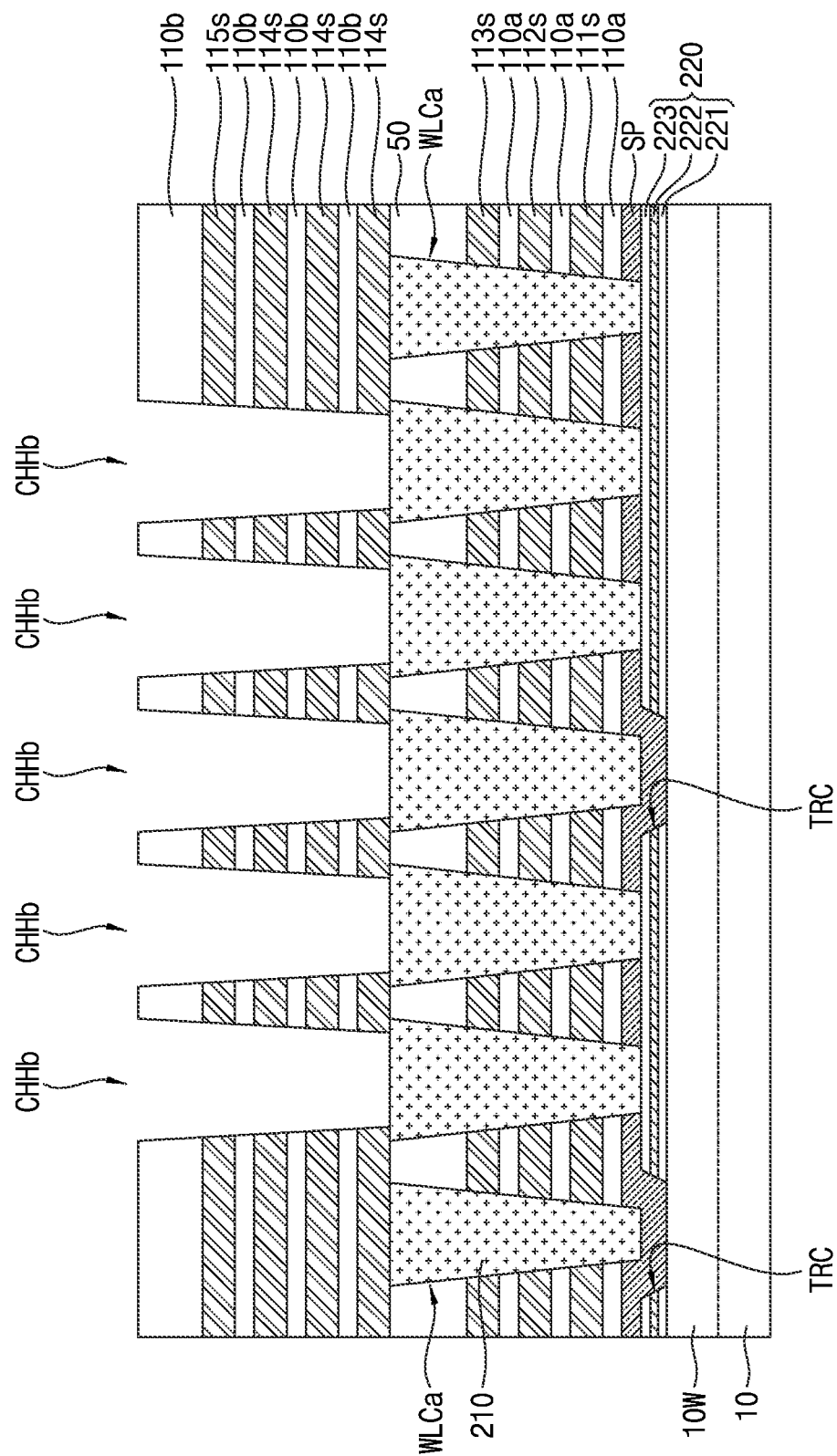

Thereafter, referring to FIG. 11, upper sacrificial structures 114s and 115s may be formed on the lower sacrificial structures 111s, 112s and 113s, the lower insulating films 110a, the planarizing insulating film 50, and the second sacrificial layer 210. Subsequently, a plurality of second channel holes CHHb may be formed to extend through the upper sacrificial structures 114s and 115s. The plurality of second channel holes CHHb may be formed by etching the upper sacrificial structures 114s and 115s through an anisotropic etching process. Positions where the plurality of second channel holes CHHb is formed may overlap positions where the plurality of first channel holes CHHa is formed, respectively. The plurality of second channel holes CHHb may extend through the upper sacrificial structures 114s and 115s, thereby exposing the second sacrificial layer 210.

The second sacrificial layer 210 filling the plurality of first channel holes CHHa may then be removed. The second sacrificial layer 210 may be removed through an etching process having etch selectivity with respect to the lower sacrificial structures 111s, 112s and 113s, the upper sacrificial structures 114s and 115s, and the first sacrificial layer 220. Accordingly, the plurality of second channel holes CHHb formed at positions corresponding to the plurality of first channel holes CHHa may be connected to the plurality of first channel holes CHHa, respectively.

Figure 12:
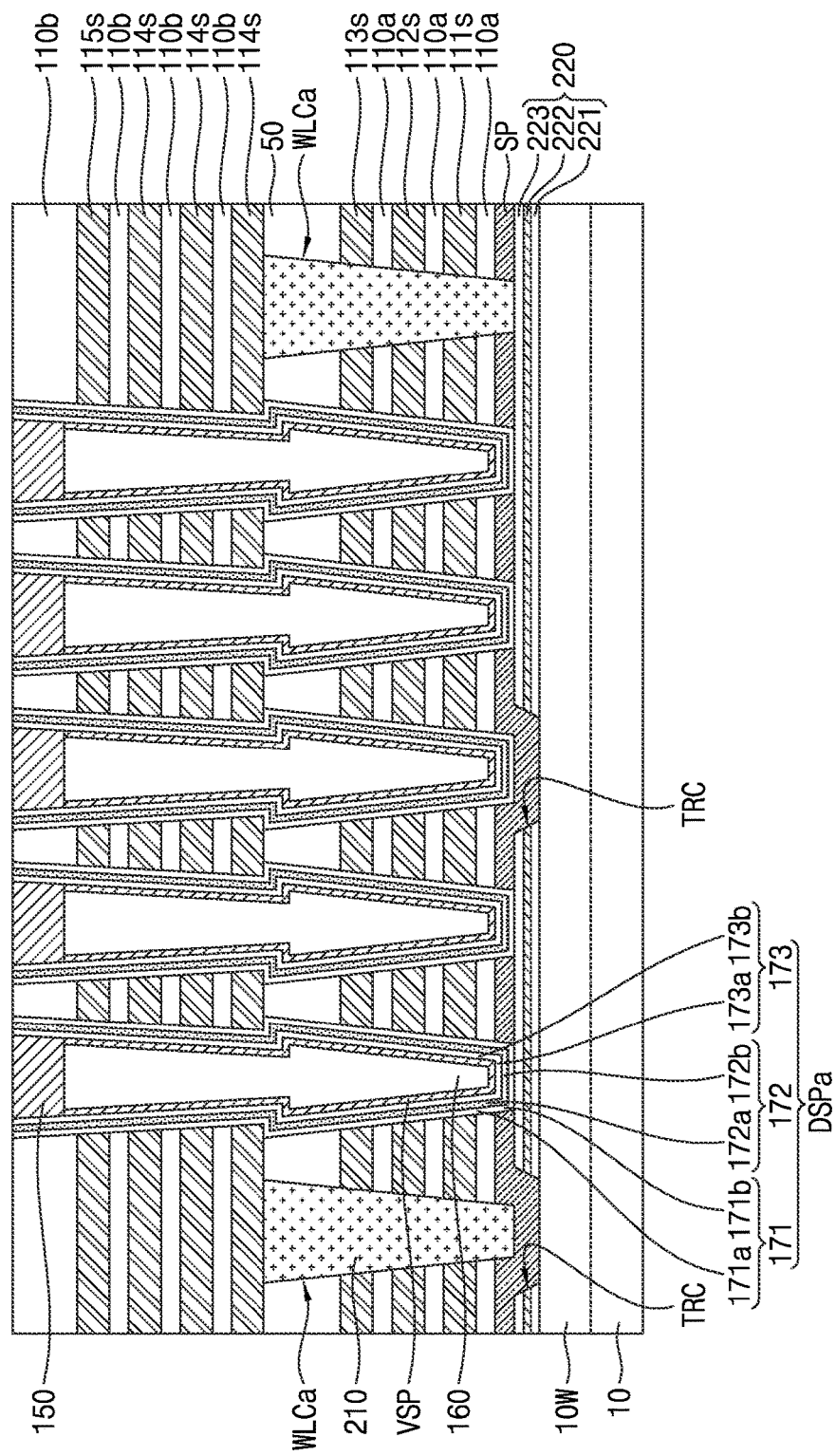

Thereafter, referring to FIG. 12, a data storage pattern DSPa, a vertical semiconductor pattern VSP, an insulating pattern 160, and a conductive pad 150 may be formed at the plurality of first channel holes CHHa and the plurality of second channel holes CHHb. In an embodiment, the data storage pattern DSPa, the vertical semiconductor pattern VSP, the insulating pattern 160, and the conductive pad 150 may be formed by depositing materials corresponding thereto to uniform thicknesses, respectively, using a method such as, for example, chemical vapor deposition (CVD) or atomic layer deposition (ALD), and then performing a planarization process.

Figure 13:
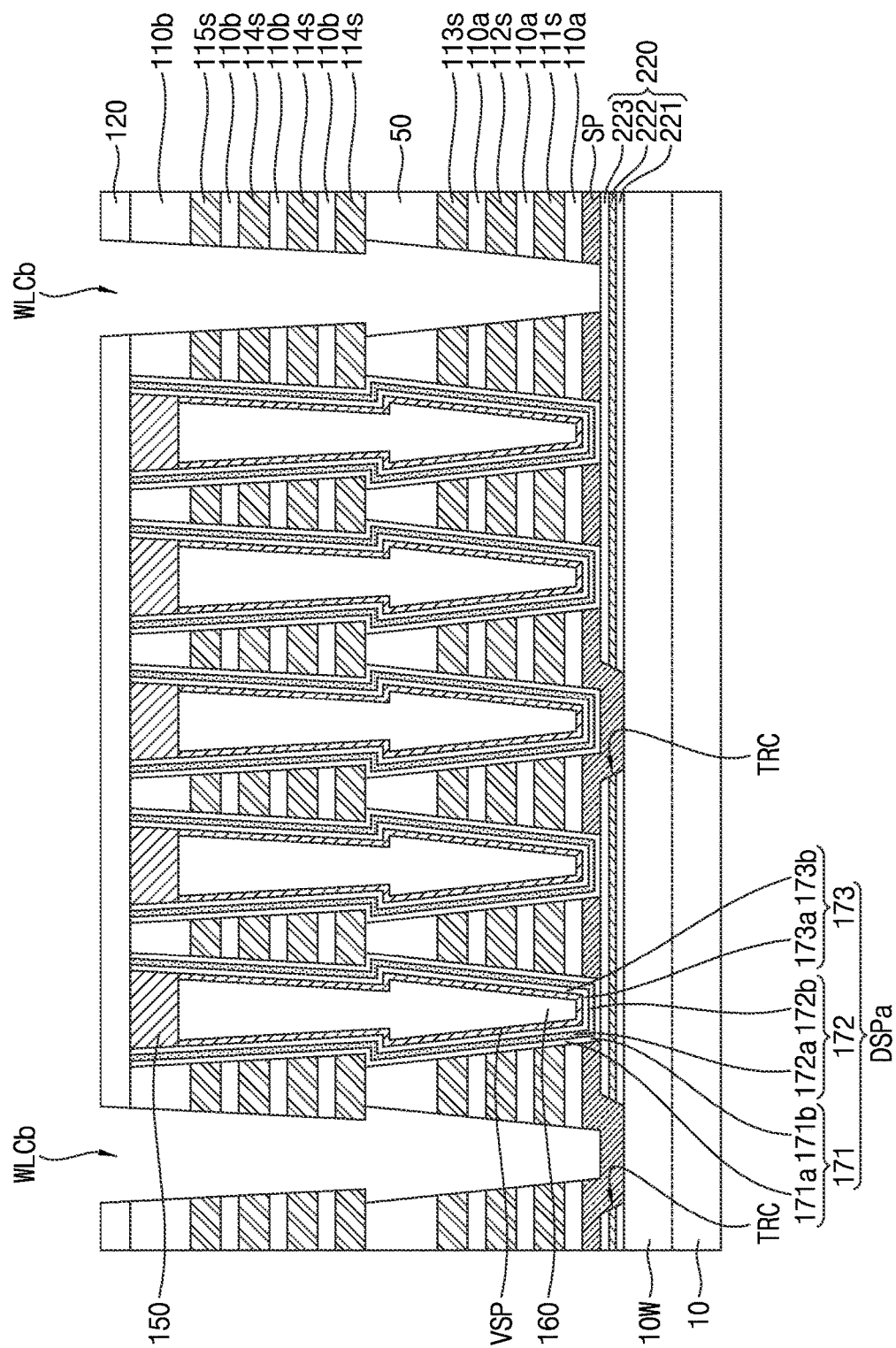

Subsequently, referring to FIG. 13, a capping insulating film 120 may be formed on the upper sacrificial structures 114s and 115s. A plurality of second word line cuts WLCb may then be formed. The plurality of second word line cuts WLCb may be formed through an etching process in which the capping insulating film 120 and the upper sacrificial structures 114s and 115s are removed from regions overlapping the remaining portions of the second sacrificial layer 210 that have not been removed, and the remaining portions of the second sacrificial layer 210 are then removed. The etching process may be an etching process having etch selectivity with respect to the capping insulating film 120, the lower sacrificial structures 111s, 112s and 113s, and the upper sacrificial structures 114s and 115s. In accordance with an embodiment, an etching process having etch selectivity with respect to the capping insulating film 120 and the upper sacrificial structures 114s and 115s may be performed, and an etching process for removing the second sacrificial layer 210 may then be performed.

Positions where the plurality of second word line cuts WLCb is produced may overlap the positions where the plurality of first word line cuts WLCa was produced, respectively. The plurality of second word line cuts WLCb may expose the sacrificial layer 220 and/or the support pattern SP.

Figure 14:
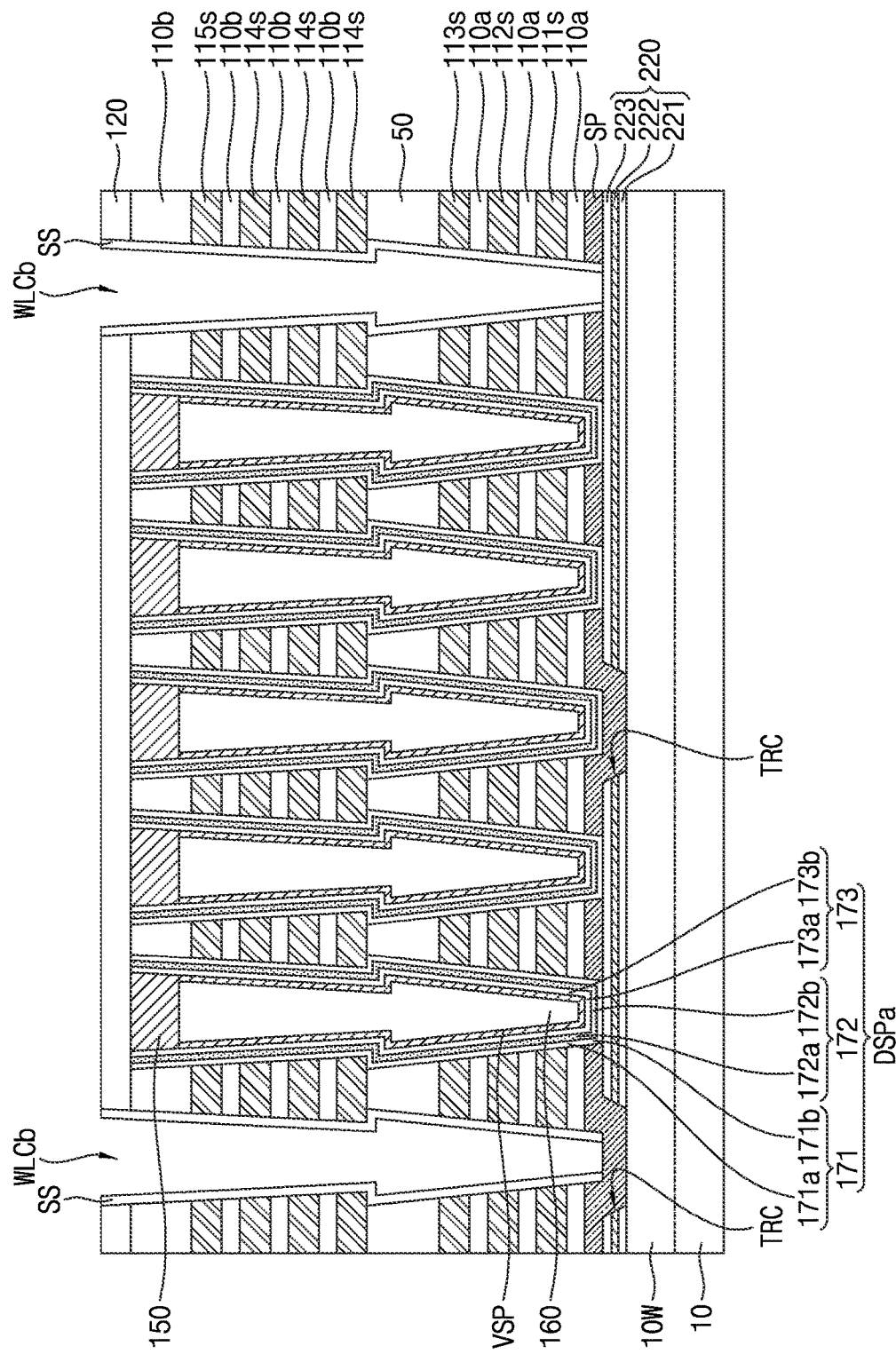

Subsequently, referring to FIG. 14, a side insulating spacer SS may be formed on an inner surface of each of the second word line cuts WLCb. The side insulating spacer SS may be formed to cover the inner surface of the second word line cut WLCb to a uniform thickness while filling the second word line cut WLCb.

Figure 15:
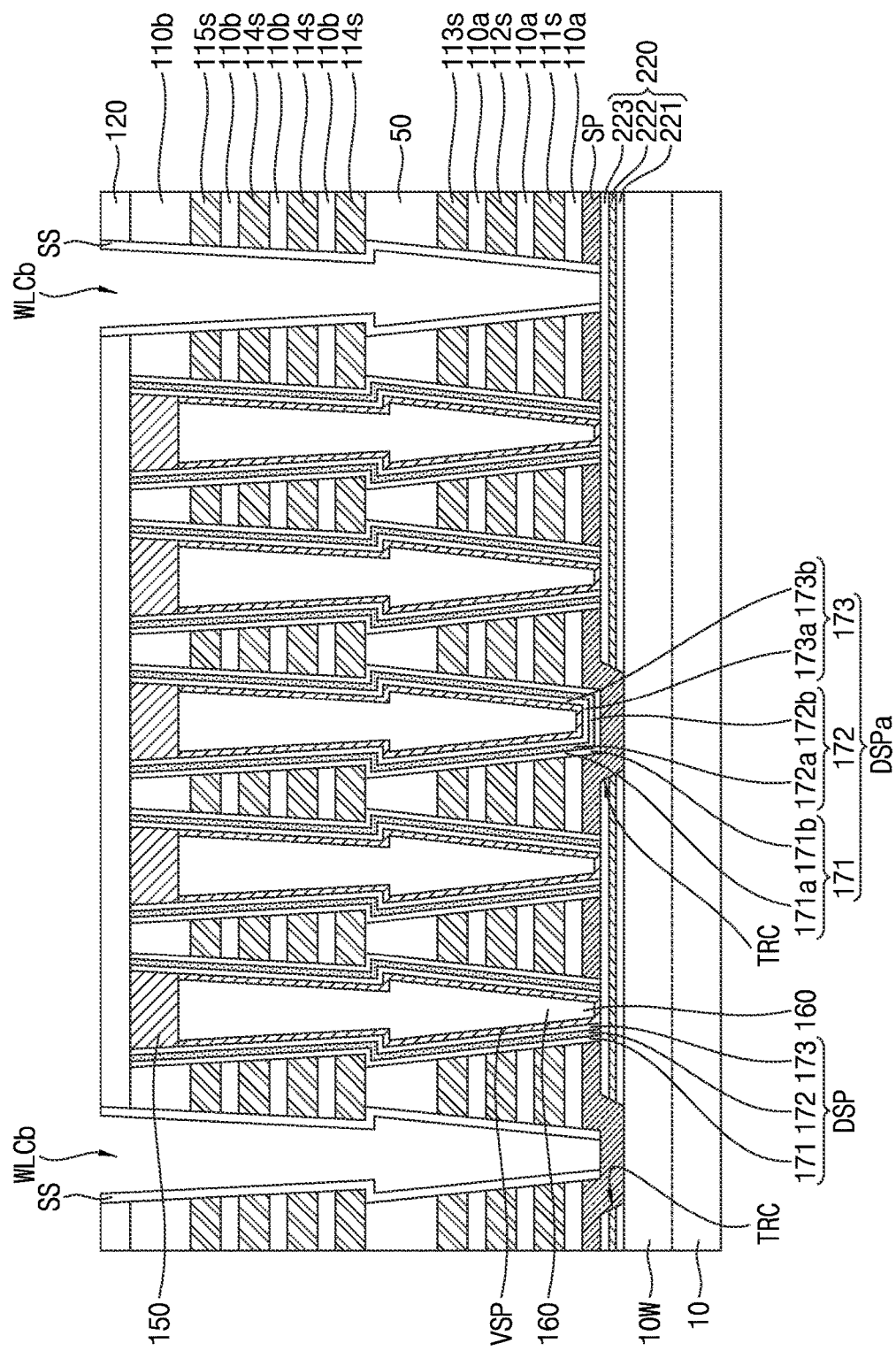

Thereafter, referring to FIG. 15, the first sacrificial layer 220 may be removed. The first sacrificial layer 220 may be removed through an etching process having etch selectivity with respect to the substrate 10 and the support pattern SP. Referring to FIGS. 14 and 15, in accordance with an embodiment, when the first sacrificial layer 220 is removed, portions 171b, 172b and 173b forming a bottom portion of the data storage pattern DSPa in each of the vertical structures VS may also be removed and, as such, a shape of the data storage pattern DSP may be provided.

Subsequently, referring to FIG. 16, a source structure material SCa may be formed under the support pattern SP. In an embodiment, the source structure material SCa may be injected through the plurality of second word line cuts WLCb. The source structure material SCA may be exposed in regions overlapping regions where the plurality of second word line cuts WLCb is formed.

In accordance with an embodiment, the source structure material SCa may be formed along inner surfaces (side walls) of the plurality of second word line cuts WLCb, and may be oxidized in the exposed regions thereof.

Figure 16:
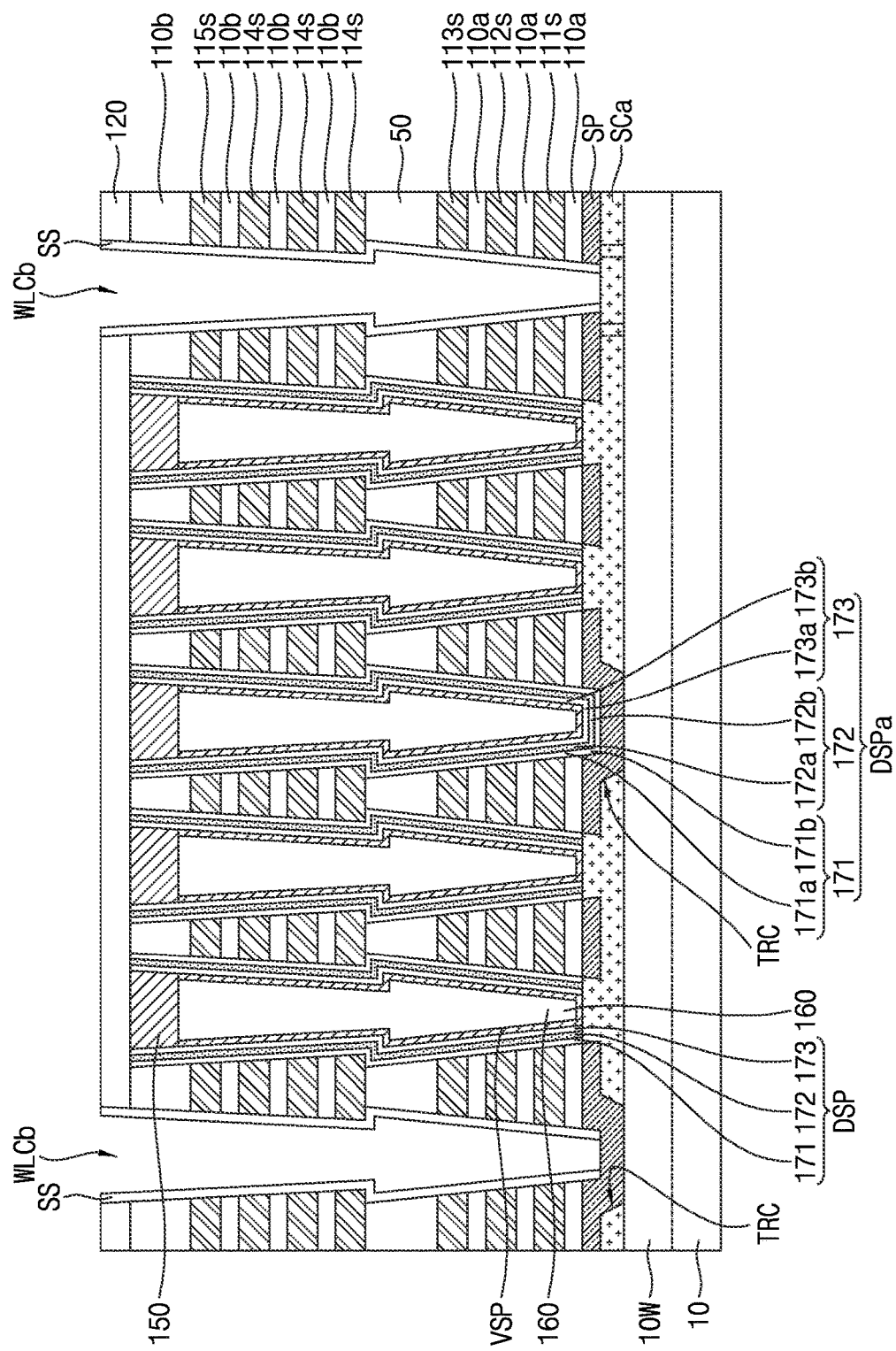
Figure 17:
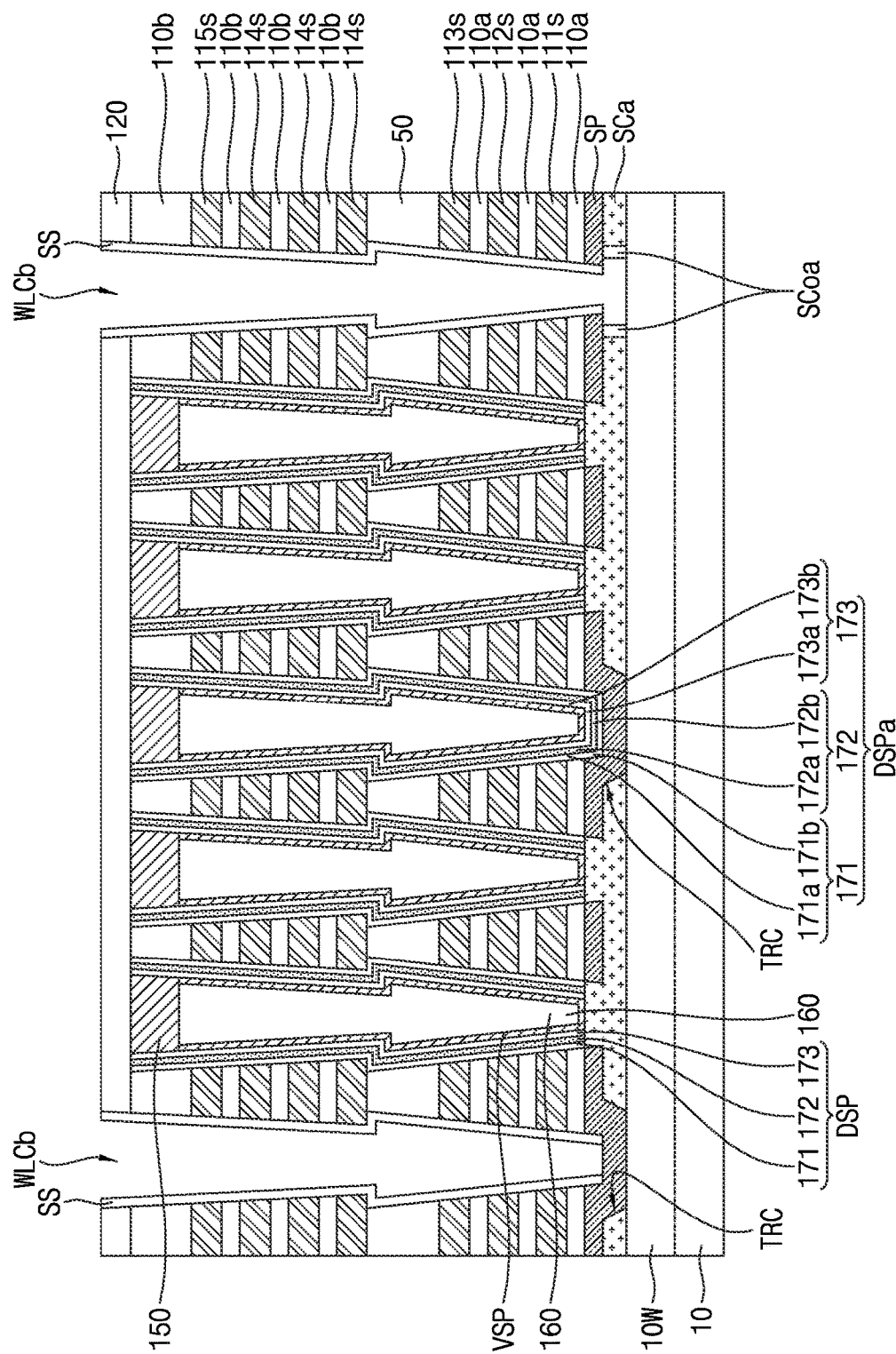

Thereafter, referring to FIGS. 16 and 17, the source structure material SCa may be removed from regions including the exposed regions through an etch-back process. An oxidized region SCoa may be formed by oxidizing, to a predetermined thickness, an inner surface of the source structure material SCa exposed through the etch-back process. As a result, a source structure including the oxidized region SCoa may be formed.

In an embodiment, a replacement process may then be performed to replace the lower sacrificial structures 111s, 112s and 113s and the upper sacrificial structures 114s and 115s with a lower electrode structure LST and an upper electrode structure UST.

In accordance with an embodiment, a nitride may remain inside the plurality of second word line cuts WLCb after removal of the source structure material SCa from predetermined regions through an etch-back process. In this case, a process for removing the nitride may be performed. In this case, an oxidized portion of the source structure material SCa (including, for example, the oxidized region SCoa) may protect the source structure from external factors. For example, the oxidized region SCoa may prevent a non-oxidized region of the source structure from being exposed and, as such, may protect the source structure in a subsequent process.

Next, a semiconductor chip according to an embodiment of the disclosure will be described. For convenience of explanation, a further description of elements and technical aspects previously described may be omitted.

Figure 18:
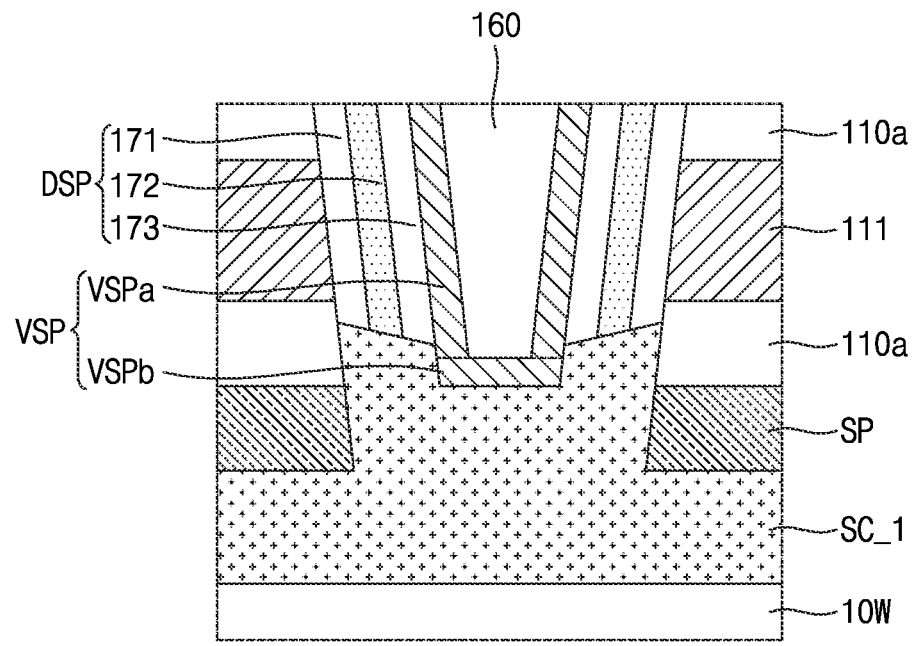
FIG. 18 is a cross-sectional view showing a portion of a semiconductor chip according to an embodiment of the disclosure.

FIG. 18 is a cross-sectional view showing a portion of a semiconductor chip according to an embodiment of the disclosure.

Referring to FIGS. 6, 7 and 18, the semiconductor chip according to an embodiment differs from an embodiment of FIG. 7 in that a source structure SC_1 contacts a lower insulating film 110a and a side portion VSPa of a vertical semiconductor pattern VSP.

In an embodiment, the source structure SC_1 may contact a lowermost one of lower insulating films 110a disposed on a support pattern SP. In an embodiment, the height of the source structure SC_1 may be lower than the height of a lower surface of a lowermost one of lower gate electrodes 111, 112 and 113 (for example, a cell gate electrode 111). That is, in an embodiment the source structure SC_1 does not contact the lower gate electrodes 111, 112 and 113.

In an embodiment, the source structure SC_1 may contact a bottom portion VSPb of the vertical semiconductor pattern VSP and a part of the side portion VSPa of the vertical semiconductor pattern VSP.

Figure 19:
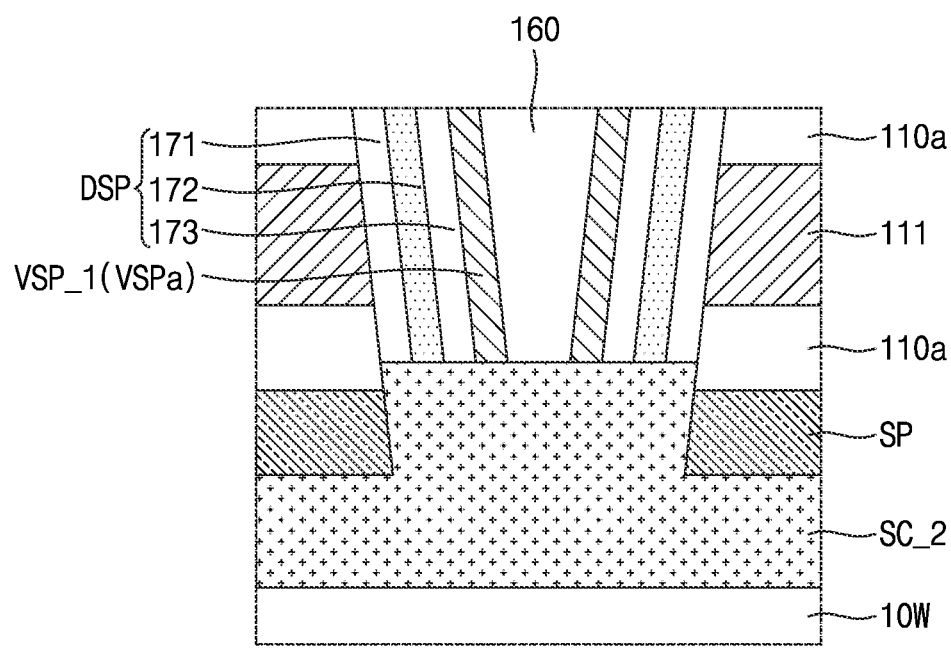
FIG. 19 is a cross-sectional view showing a portion of a semiconductor chip according to an embodiment of the disclosure.

FIG. 19 is a cross-sectional view showing a portion of a semiconductor chip according to an embodiment of the disclosure.

Referring to FIGS. 6, 7 and 19, the semiconductor chip according to an embodiment differs from an embodiment of FIG. 7 in that a bottom portion VSPb of a vertical semiconductor pattern VSP_1 is omitted.

In an embodiment, the vertical semiconductor pattern VSP_1 may have the form of a pipe opened at upper and lower ends thereof. In this case, the height of an upper surface of a source structure SC_2 may be greater than the height of an upper surface of a support pattern SP (in regions contacting vertical structures VS). The height of the upper surface of the source structure SC_2 may be smaller than the height of a lower surface of an erase control gate electrode 112.

As apparent from the above description, in accordance with embodiments of the disclosure, a common source line may be connected to lower portions of channels.

In addition, in the manufacture of a semiconductor chip, a high aspect ratio contact (HARC) etching process may be efficiently performed.

While the present disclosure has been particularly shown and described with reference to the embodiments thereof, it will be understood by those of ordinary skill in the art that various changes in form and detail may be made therein without departing from the spirit and scope of the present disclosure as defined by the following claims.

What is claimed is:

1. A semiconductor chip, comprising:
a substrate;
a source structure disposed on the substrate;
a support pattern disposed on the source structure, wherein each of the source structure and the support pattern comprises polysilicon;
an electrode structure disposed on the support pattern; and
a plurality of vertical structures extending vertically through the electrode structure,
wherein the electrode structure comprises:
a lower electrode structure disposed on the support pattern and comprising a plurality of lower gate electrodes and a plurality of first insulating films;
a second insulating film disposed on the lower electrode structure; and
an upper electrode structure disposed on the second insulating film and comprising a plurality of upper gate electrodes and a plurality of third insulating films,
wherein the vertical structures contact an upper surface of the source structure above the source structure.

2. The semiconductor chip according to claim 1, wherein each of the vertical structures comprises:
a vertical semiconductor pattern contacting the source structure; and
a data storage pattern interposed between the vertical semiconductor pattern and the electrode structure.

3. The semiconductor chip according to claim 2, wherein the vertical semiconductor pattern comprises a bottom portion and a side portion forming a cup shape opened at an upper end and closed at a lower end, and the bottom portion contacts the source structure.

4. The semiconductor chip according to claim 2, wherein each of the vertical structures does not extend through the source structure.

5. The semiconductor chip according to claim 1, further comprising:
a dummy vertical structure extending vertically through the electrode structure,
wherein the dummy vertical structure is directly disposed on the support pattern.

6. The semiconductor chip according to claim 5, wherein the dummy vertical structure does not extend through the support pattern.

7. The semiconductor chip according to claim 5, wherein the dummy vertical structure has a greater depth than each of the vertical structures.

8. The semiconductor chip according to claim 1, further comprising:
a plurality of common source plugs disposed at opposite sides of the electrode structure, respectively, and contacting the substrate,
wherein the common source plugs are directly disposed on the support pattern in a predetermined region.

9. The semiconductor chip according to claim 1, wherein an etch selectivity of the support pattern is different from an etch selectivity of the source structure.

10. The semiconductor chip according to claim 1, wherein a height of the upper surface of the source structure is greater than a height of an upper surface of the support pattern in regions where the source structure contacts the vertical structures, respectively.

11. The semiconductor chip according to claim 10, wherein the source structure contacts side and bottom portions of a vertical semiconductor pattern included in each of the vertical structures.

12. The semiconductor chip according to claim 10, wherein the source structure contacts an insulating film disposed on a lowermost layer in the lower electrode structure.

13. The semiconductor chip according to claim 10, wherein a height of the upper surface of the source structure is lower than a height of a lower surface of a gate electrode disposed on a lowermost layer in the lower electrode structure in regions where the source structure contacts the vertical structures, respectively.

14. A semiconductor chip, comprising:
a substrate comprising a cell array region in which cells storing data are disposed, and a connecting region in which a peripheral circuit that provides an electrical signal to the cell array region is disposed;
a source structure disposed on the substrate and comprising polysilicon;
a support pattern disposed on the source structure and comprising polysilicon;
an electrode structure disposed on the support pattern; and
a plurality of vertical structures extending vertically through the electrode structure and contacting the source structure,
wherein the electrode structure comprises:
a lower electrode structure disposed on the support pattern and comprising a plurality of lower gate electrodes and a plurality of first insulating films,
a second insulating film disposed on the lower electrode structure; and
an upper electrode structure disposed on the second insulating film and comprising a plurality of upper gate electrodes and a plurality of third insulating films, wherein an upper surface of the substrate is flat in the cell array region.

15. The semiconductor chip according to claim 14, wherein the vertical structures are disposed in the cell array region.

16. The semiconductor chip according to claim 14, wherein the source structure contacts bottom portions of the vertical structures.

17. The semiconductor chip according to claim 14, further comprising:
a plurality of common source plugs disposed in the cell array region and the connecting region, the common source plugs being provided at opposite sides of the electrode structure, respectively, and connected to the substrate,
wherein the common source plugs are directly disposed on the support pattern in a predetermined region.

18. The semiconductor chip according to claim 17, wherein the source structure is oxidized to a predetermined thickness in regions where the source structure contacts the common source plugs, respectively.

19. The semiconductor chip according to claim 14, further comprising:
a dummy vertical structure disposed in the cell array region and extending vertically through the electrode structure,
wherein the dummy vertical structure comprises a dummy data storage pattern having forming a cup shape opened at an upper end and closed at a lower end, and
wherein a portion of the dummy data storage pattern forming a bottom portion of the dummy data storage pattern contacts the support pattern.

20. A semiconductor device, comprising:
a main substrate;
a controller;
one or more semiconductor packages; and
a dynamic random access memory (DRAM),
wherein the controller, the one or more semiconductor packages, and the DRAM are mounted on the main substrate,
wherein each of the semiconductor packages comprises:
a package substrate;
a plurality of semiconductor chips disposed on the package substrate;
a connecting structure that connects the semiconductor chips to the package substrate; and
a molding layer that covers the semiconductor chips and the connecting structure on the package substrate,
wherein each of the semiconductor chips comprises:
a substrate;
a source structure disposed on the substrate and comprising polysilicon;
a support pattern disposed on the source structure and comprising polysilicon;
an electrode structure disposed on the support pattern; and
a plurality of vertical structures extending vertically through the electrode structure,
wherein the electrode structure comprises:
a lower electrode structure disposed on the support pattern and comprising a plurality of lower gate electrodes and a plurality of first insulating films;
a second insulating film disposed on the lower electrode structure; and
an upper electrode structure disposed on the second insulating film and comprising a plurality of upper gate electrodes and a plurality of third insulating films,
wherein the vertical structures contact an upper surface of the source structure above the source structure.

* * * * *